(12) United States Patent
Honda et al.

(10) Patent No.: US 7,301,829 B2
(45) Date of Patent: Nov. 27, 2007

(54) SEMICONDUCTOR STORAGE APPARATUS

(75) Inventors: Takeshi Honda, Tokyo (JP); Noboru Sakimura, Tokyo (JP); Tadahiko Sugibayashi, Tokyo (JP)

(73) Assignee: NEC Corporation, Tokyo (JP)

( * ) Notice: Subject to any disclaimer, the term of this patent is extended or adjusted under 35 U.S.C. 154(b) by 199 days.

(21) Appl. No.: 10/541,645

(22) PCT Filed: Dec. 26, 2003

(86) PCT No.: PCT/JP03/16981

§ 371 (c)(1),
(2), (4) Date: Jul. 6, 2005

(87) PCT Pub. No.: WO2004/061854

PCT Pub. Date: Jul. 22, 2004

(65) Prior Publication Data
US 2006/0126377 A1 Jun. 15, 2006

(30) Foreign Application Priority Data
Jan. 6, 2003 (JP) ............................ 2003-000455

(51) Int. Cl.
*G11C 5/14* (2006.01)
(52) U.S. Cl. ................. 365/189.09; 365/158; 365/171; 365/173
(58) Field of Classification Search ................ 365/158, 365/171, 189.09, 173
See application file for complete search history.

(56) References Cited

U.S. PATENT DOCUMENTS
6,762,970 B2 * 7/2004 Joo ....................... 365/230.06

FOREIGN PATENT DOCUMENTS

| JP | 10-106255 | 4/1998 |
|---|---|---|
| JP | 2001-195878 | 7/2001 |
| JP | 2001-325791 | 11/2001 |
| JP | 2002-008367 | 1/2002 |
| JP | 2002-074974 | 3/2002 |
| JP | 2002-093144 | 3/2002 |
| JP | 2002-170374 | 6/2002 |
| JP | 2002-170375 | 6/2002 |
| JP | 2002-170376 | 6/2002 |
| JP | 2002-197852 | 7/2002 |
| JP | 2003-123464 | 4/2003 |
| JP | 2003-257175 | 9/2003 |

* cited by examiner

*Primary Examiner*—Son Dinh
*Assistant Examiner*—Pho M. Luu
(74) *Attorney, Agent, or Firm*—Scully, Scott, Murphy & Presser, P.C.

(57) ABSTRACT

A semiconductor memory device in which information is written into a storage element by flowing current. The semiconductor memory device has a shortened write speed and reduced power consumption by preventing parasitic capacitors from prolonging the time required for a write current to reach a predetermined value. The semiconductor memory device includes storage elements for storing information, a constant current source for writing information into the storage element by flowing current, and a boost circuit for charging parasitic capacitors by a time when an amount of a current flowed by the constant current source reaches an amount of a current required to write information into the storage element, at a predetermined position related to the storage element.

13 Claims, 21 Drawing Sheets

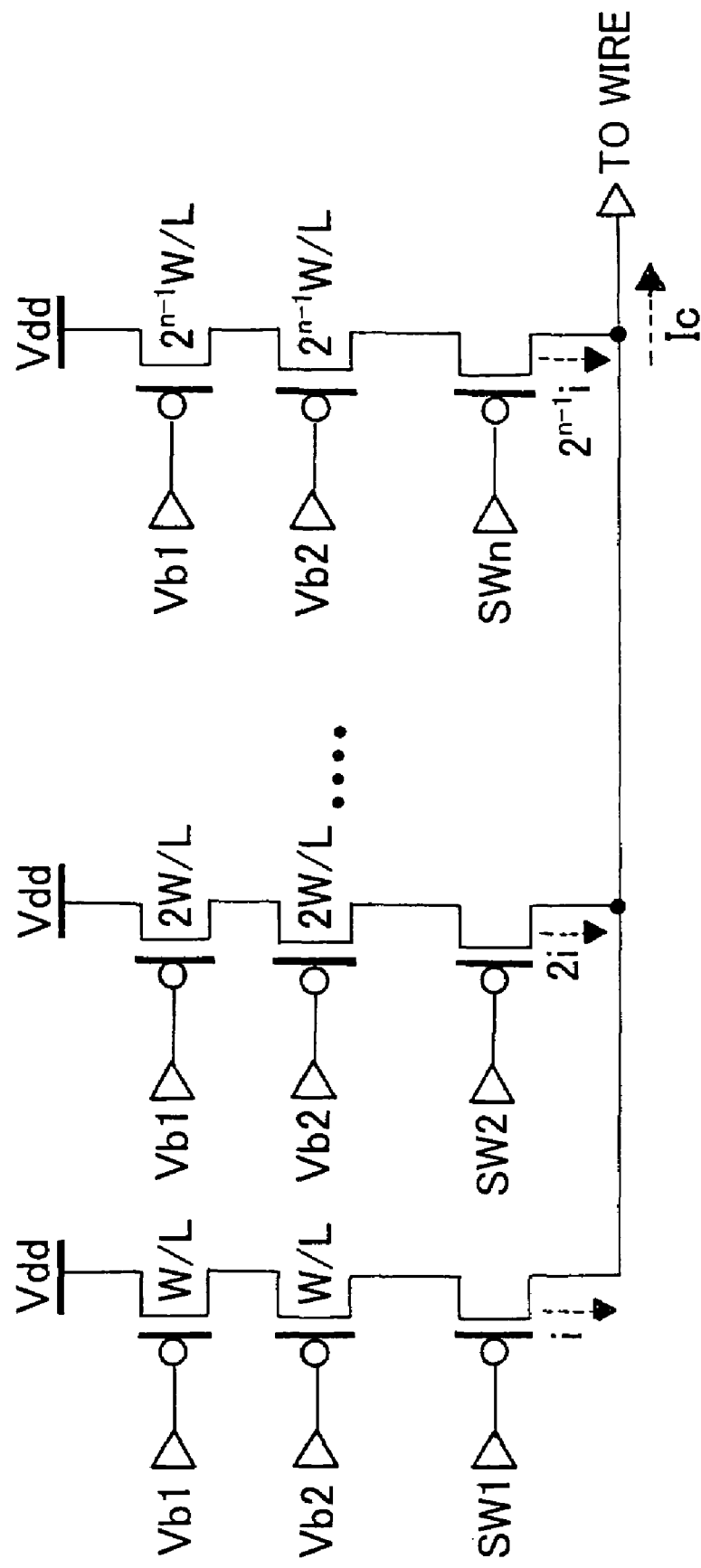

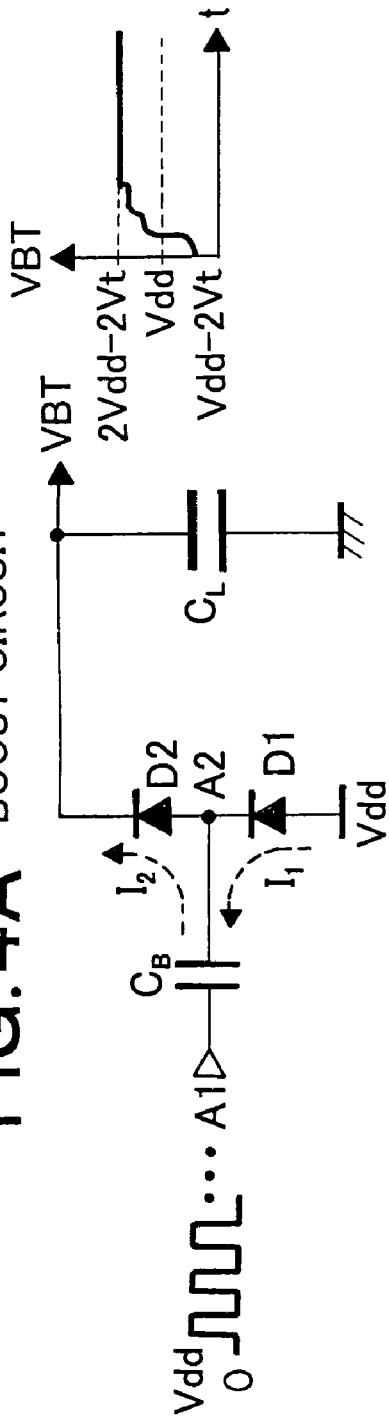
FIG. 4A BOOST CIRCUIT
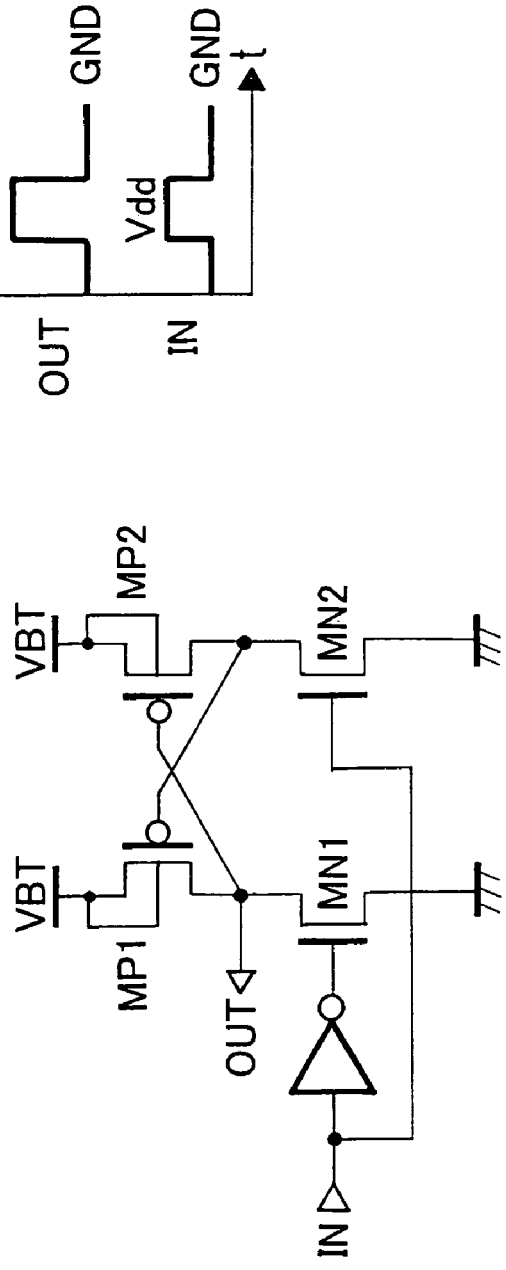
FIG. 4B LEVEL SHIFT CIRCUIT

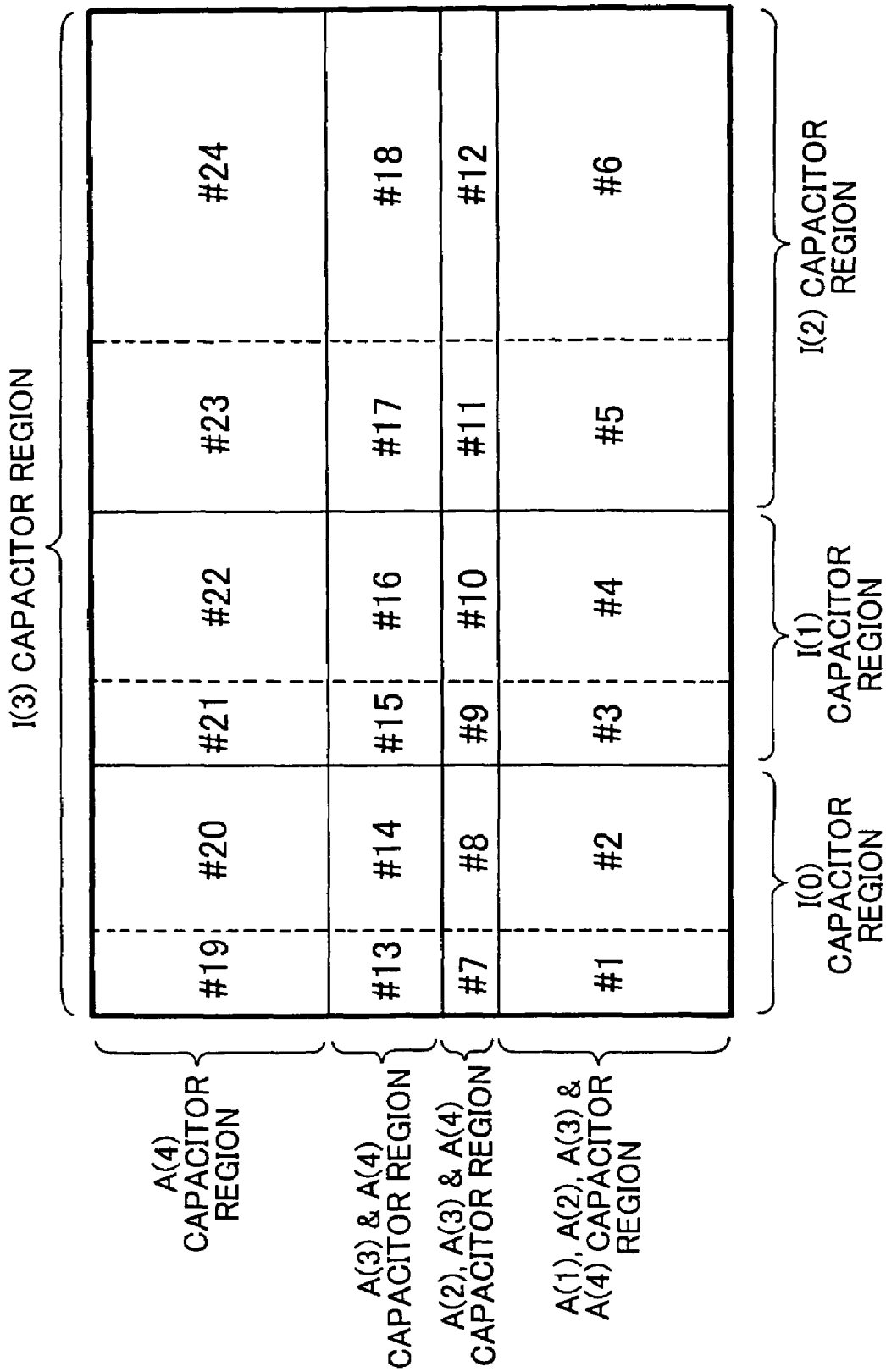

FIG.11

| | CURRENT (3:0) | ARRAY (4:1) | ADJUSTMENT (3:0) | CAPACITANCE (PF) | CAPACITORS TO BE USED |
|---|---|---|---|---|---|
| 1 | I(0) | A(1) | S(0) | 0.0 | NOTHING |
| 2 | I(0) | A(1) | S(1) | 1.0 | #1 |
| 3 | I(0) | A(1) | S(2) | 2.0 | #2 |
| 4 | I(0) | A(1) | S(3) | 3.0 | #1,#2 |
| 5 | I(0) | A(2) | S(0) | 0.0 | NOTHING |
| 6 | I(0) | A(2) | S(1) | 1.1 | #1,#7 |
| 7 | I(0) | A(2) | S(2) | 2.2 | #2,#8 |
| 8 | I(0) | A(2) | S(3) | 3.3 | #1,#2,#7,#8 |
| 9 | I(0) | A(3) | S(0) | 0.0 | NOTHING |
| 10 | I(0) | A(3) | S(1) | 1.3 | #1,#7,#13 |
| 11 | I(0) | A(3) | S(2) | 2.6 | #2,#8,#14 |
| 12 | I(0) | A(3) | S(3) | 3.9 | #1,#2,#7,#8,#13,#14 |
| 13 | I(0) | A(4) | S(0) | 0.0 | NOTHING |
| 14 | I(0) | A(4) | S(1) | 1.5 | #1,#7,#13,#19 |
| 15 | I(0) | A(4) | S(2) | 3.0 | #2,#8,#14,#20 |
| 16 | I(0) | A(4) | S(3) | 4.5 | #1,#2,#7,#8,#13,#14,#19,#20 |
| 17 | I(1) | A(1) | S(0) | 0.0 | NOTHING |
| 18 | I(1) | A(1) | S(1) | 2.0 | #1,#3 |
| 19 | I(1) | A(1) | S(2) | 4.0 | #2,#4 |
| 20 | I(1) | A(1) | S(3) | 6.0 | #1-#4 |
| 21 | I(1) | A(2) | S(0) | 0.0 | NOTHING |
| 22 | I(1) | A(2) | S(1) | 2.2 | #1,#3,#7,#9 |
| 23 | I(1) | A(2) | S(2) | 4.4 | #2,#4,#8,#10 |
| 24 | I(1) | A(2) | S(3) | 6.6 | #1,#2,#7,#8 |
| 25 | I(1) | A(3) | S(0) | 0.0 | NOTHING |
| 26 | I(1) | A(3) | S(1) | 2.6 | #1,#3,#7,#9,#13,#15 |
| 27 | I(1) | A(3) | S(2) | 5.2 | #2,#4,#8,#10,#14,#16 |
| 28 | I(1) | A(3) | S(3) | 7.8 | #1-#4,#7-#10,#13-#16 |
| 29 | I(1) | A(4) | S(0) | 0.0 | NOTHING |
| 30 | I(1) | A(4) | S(1) | 3.4 | #1,#3,#7,#9,#13,#15,#19,#21 |
| 31 | I(1) | A(4) | S(2) | 7.8 | #2,#4,#8,#10,#14,#16,#20,#22 |
| 32 | I(1) | A(4) | S(3) | 11.2 | #1-#4,#7-#10,#13-#16,#19-#22 |
| 33 | I(2) | A(1) | S(0) | 0.0 | NOTHING |
| 34 | I(2) | A(1) | S(1) | 3.0 | #1,#5 |
| 35 | I(2) | A(1) | S(2) | 6.0 | #2,#6 |
| 36 | I(2) | A(1) | S(3) | 9.0 | #1,#2,#5,#6 |
| 37 | I(2) | A(2) | S(0) | 0.0 | NOTHING |
| 38 | I(2) | A(2) | S(1) | 3.3 | #1,#5,#7,#11 |
| 39 | I(2) | A(2) | S(2) | 6.6 | #2,#6,#8,#12 |
| 40 | I(2) | A(2) | S(3) | 9.9 | #1,#2,#5,#6,#7,#8,#11,#12 |
| 41 | I(2) | A(3) | S(0) | 0.0 | NOTHING |
| 42 | I(2) | A(3) | S(1) | 3.9 | #1,#5,#7,#11,#13,#17 |
| 43 | I(2) | A(3) | S(2) | 7.8 | #2,#6,#8,#12,#14,#18 |
| 44 | I(2) | A(3) | S(3) | 11.7 | #1,#2,#5-#8,#11-#14,#17,#18 |
| 45 | I(2) | A(4) | S(0) | 0.0 | NOTHING |
| 46 | I(2) | A(4) | S(1) | 5.1 | #1,#5,#7,#11,#13,#17,#19,#23 |
| 47 | I(2) | A(4) | S(2) | 10.2 | #2,#6,#8,#12,#14,#18,#20,#24 |
| 48 | I(2) | A(4) | S(3) | 15.3 | #1,#2,#5-#8,#11-#14,#17-#20,#23,#24 |
| 49 | I(3) | A(1) | S(0) | 0.0 | NOTHING |
| 50 | I(3) | A(1) | S(1) | 4.0 | #1,#3,#5 |
| 51 | I(3) | A(1) | S(2) | 8.0 | #2,#4,#6 |
| 52 | I(3) | A(1) | S(3) | 12.0 | #1-#6 |
| 53 | I(3) | A(2) | S(0) | 0.0 | NOTHING |
| 54 | I(3) | A(2) | S(1) | 4.4 | #1,#3,#5,#7,#9,#11 |
| 55 | I(3) | A(2) | S(2) | 8.8 | #2,#4,#6,#8,#10,#12 |
| 56 | I(3) | A(2) | S(3) | 13.2 | #1-#12 |
| 57 | I(3) | A(3) | S(0) | 0.0 | NOTHING |
| 58 | I(3) | A(3) | S(1) | 5.2 | #1,#3,#5,#7,#9,#11,#13,#15,#17 |
| 59 | I(3) | A(3) | S(2) | 10.4 | #2,#4,#6,#8,#10,#12,#14,#16,#18 |
| 60 | I(3) | A(3) | S(3) | 15.6 | #1-#18 |
| 61 | I(3) | A(4) | S(0) | 0.0 | NOTHING |
| 62 | I(3) | A(4) | S(1) | 6.8 | #1,#3,#5,#7,#9,#11,#13,#15,#17,#19,#21,#23 |
| 63 | I(3) | A(4) | S(2) | 13.6 | #2,#4,#6,#8,#10,#12,#14,#16,#18,#20,#22,#24 |
| 64 | I(3) | A(4) | S(3) | 20.4 | #1-#24 |

FIG.16 PRIOR ART
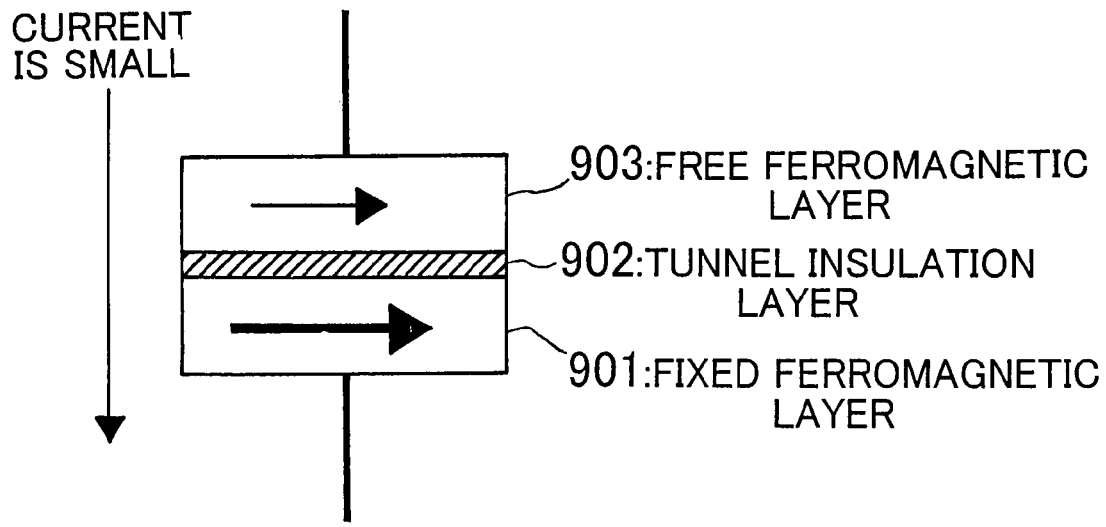
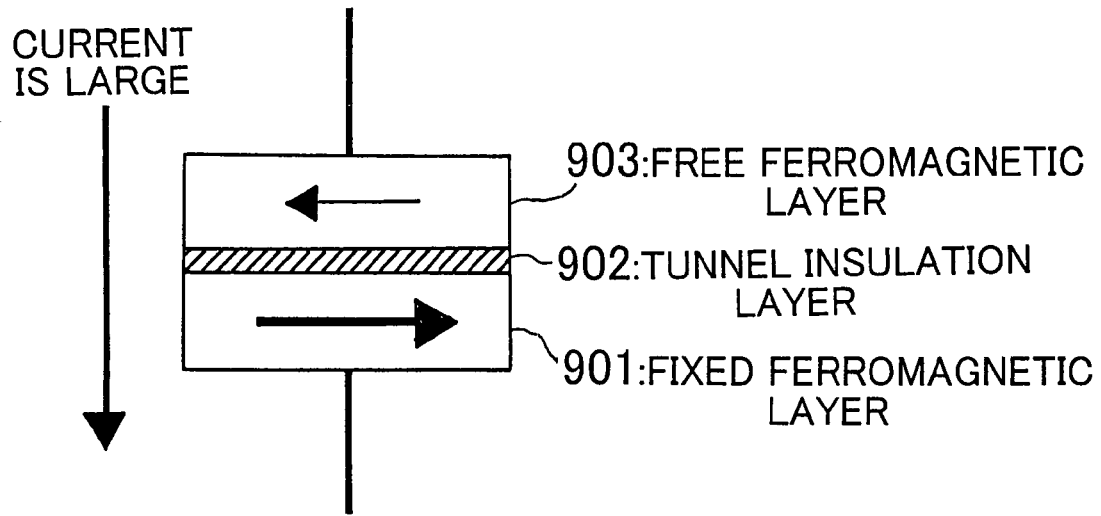

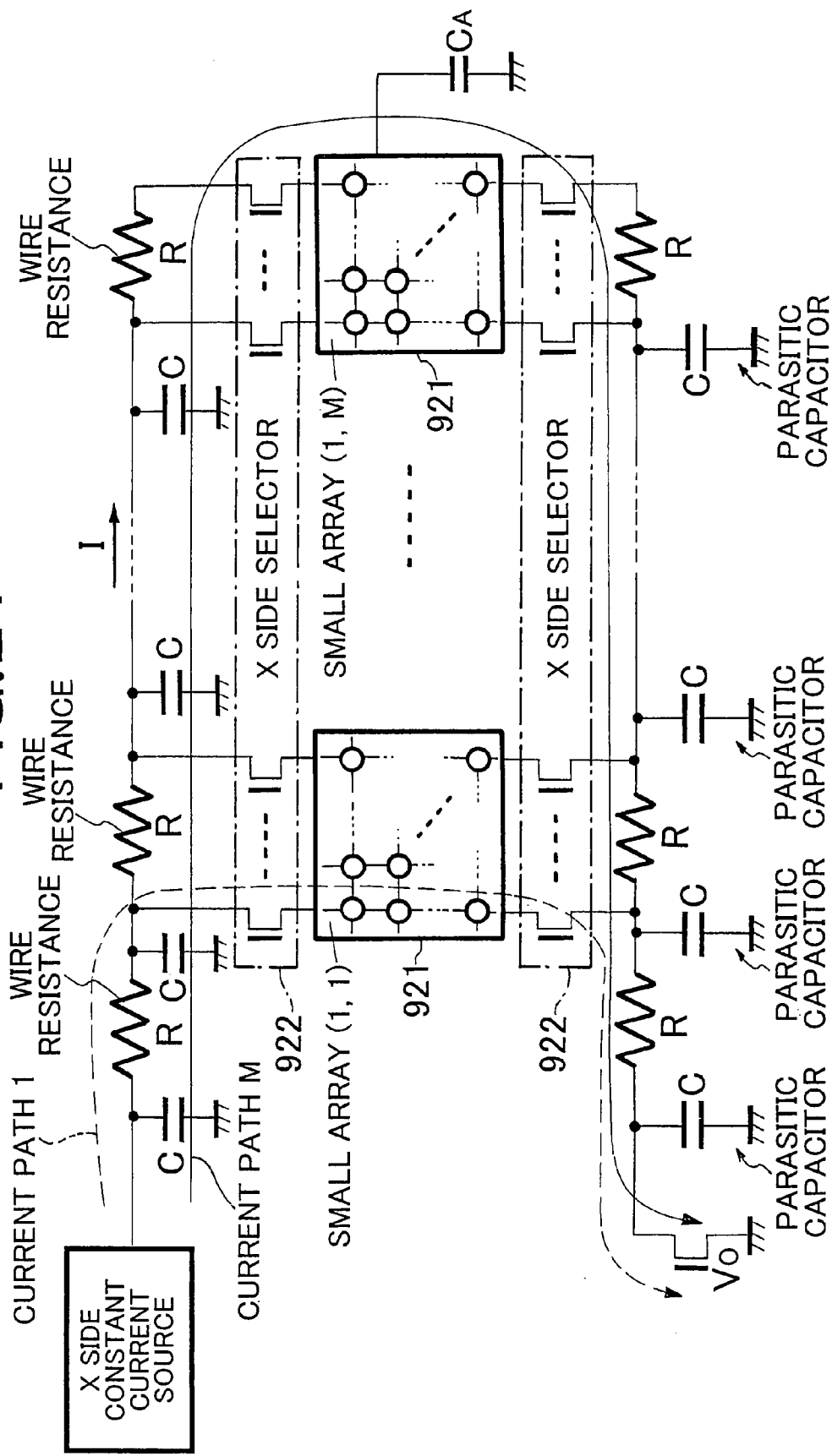

SEMICONDUCTOR STORAGE APPARATUS

TECHNICAL FIELD

The present invention relates to a semiconductor memory device in which information is written into a storage element by flowing current. In particular, the present invention relates to a semiconductor memory device in which information is written into a tunnel magnetoresistance element by a magnetic field generated by flowing current.

BACKGROUND ART

In recent years, demand for a memory having characteristics of nonvolatility, a large storage capacity, a low voltage operation and low power consumption is increasing as a result of rapid spread of portable telephone or the like. The MRAM (magnetic random access memory) is anticipated as a memory having these characteristics. A storage element of the MRAM includes a TMR (tunnel magnetoresistance) element. Each TMR element has, for example, a configuration as shown in FIG. 16. The TMR element is formed by successively stacking a fixed ferromagnetic layer (pin layer) 901, a tunnel insulation layer 902, and a free ferromagnetic layer (free layer) 903. The direction of magnetization of the pin layer 901 is fixed at the time of manufacture. On the other hand, the magnetization direction of the free layer 903 can be reversed by magnetic fields generated by currents in wires. For example, the magnetization direction of the free layer 903 can be reversed by magnetic fields generated by a current flowing through a bit line BL and a current flowing through a word line WL. "1" or "0" is assigned according to the direction of the magnetization. When the relative magnetization direction between the pin layer 901 and the free layer 903 is parallel ("0" in FIG. 16), the electrical resistance is low. When the relative magnetization direction between the pin layer 901 and the free layer 903 is antiparallel ("1" in FIG. 16), the electrical resistance is high. By detecting the difference in electrical resistance, therefore, the state of the storage element can be read out.

A semiconductor memory device using the TMR element having such a configuration as a memory cell has a configuration in which a plurality of memory cells 904 are arranged in a matrix form as shown in FIG. 17A. The semiconductor memory device includes as components a plurality of bit lines BL 905 which extend in the lateral direction over the memory cells, and a plurality of word lines WL 906 which extend in the longitudinal direction under the memory cells. Each memory cell 904 includes the TMR element. When a current flows through each of a bit line BL and a word line WL disposed over and under a selected cell and a combination of magnetic fields $H_Y$ and $H_X$ generated by respective currents satisfies a predetermined condition, the magnetization direction of the free layer can be reversed. A combination of the weakest magnetic fields required for magnetization reversal forms a curve called an asteroid curve as shown in FIG. 17B. (In FIG. 17B, reversal from "0" to "1" is assumed.) If a magnetic field of outside of the asteroid curve (i.e., a magnetic field in the "Reversal" region and "Multiple Write" region) is applied, writing into a selected cell S is conducted. For example, if an X direction magnetic field $H_{DX}$ and a Y direction magnetic field $H_{DY}$ shown in FIG. 17B is applied, magnetization reversal is caused because a magnetic field vector $(H_X, H_Y)=(H_{DX}, H_{DY})$ in the selected cell S is in the reversal region. In other words, data "0" or "1" can be written by reversing the magnetization direction. In unselected memory cells $U_X$ and $U_Y$ on the selected bit line and the selected word line, respectively, magnetization reversal is not caused at this time, because only the magnetic field $H_{DX}$ and $H_{DY}$, respectively, which fall inside the asteroid curve ("Retention" region) is present. In other words, selective writing is conducted.

The magnetic field $(H_X, H_Y)$ can be rewritten with respect to a word line current $I_{DY}$ and a bit line current $I_{DX}$ by using the Ampere's law (I=H/2, r, where r is a distance between the center of wire and the center of the magnetic substance). A result of rewriting is shown in FIG. 17C. If the word line current $I_{DY}$ and the bit line current $I_{DX}$ are flowed, magnetization reversal is caused, because the current combination $(I_{BL}, I_{WL})=(I_{DX}, I_{DY})$ in the selected cell S is in the reversal region. In other words, data "0" or "1" can be written by reversing the magnetization direction. In unselected memory cells $U_X$ and $U_Y$ on the selected bit line and the selected word line, respectively, magnetization reversal is not caused at this time, because only the current $I_{DX}$ and $I_{DY}$, respectively, which fall inside the asteroid curve ("Retention" region) flows. In other words, selective writing is conducted.

In the case of the MRAM, however, a large number of unselected cells are connected to the selected bit line BL 905 and the selected word line WL 906 as shown in FIG. 17A. If currents flow through the lines, therefore, these unselected cells are subject to the disturbing magnetic field. For example, if a write current in a checkered region ("Multiple Write" region) in FIG. 17C is flowed, writing into the unselected memory cells $U_X$ and $U_Y$ is also conducted, because the current $I_{BL}$ in the unselected memory cell $U_X$ and the current $I_{WL}$ in the unselected memory cell $U_Y$ go outside the asteroid curve. In other words, false writing is conducted. For conducting selective writing, therefore, it is necessary to let currents in the "Reversal" region represented by an unshaded portion in FIG. 17C flow, and accurate adjustment of write currents is necessary.

As prior technique reference relating to the present invention, the following can be mentioned.

JP-A-2001-195878
JP-A-2001-325791
JP-A-2002-008367
JP-A-2002-074974
JP-A-2002-170374
JP-A-2002-170375
JP-A-2002-170376
JP-A-2002-197852
JP-A-2003-257175

DISCLOSURE OF INVENTION

The magnetization reversal time of a magnetic substance is as fast as one nanosecond or less. Therefore, it is one of merits of the MRAM that fast writing is possible in principle. Since the write current of the MRAM is required to be accurate as described in the description of the background art above, however, it is necessary to use a constant current source as the write current source. In the conventional constant current write circuit described above, electric charges are stored on parasitic capacitors which are present on wire and in selectors immediately after the write current source is turned on. Therefore, a certain time is needed until a constant current actually flows in the position of the selected cell at the selected bit line BL 905 and the selected word line WL 906. This results in a problem that power consumption at the time of writing increases. This problem will now be described with reference to FIGS. 18 to 21. FIG. 18 shows a memory cell array (four by four cells are shown.). A constant current source circuit is prepared on each of the X side and Y side. Ideally, as shown in FIG. 19A, constant currents ICX and ICY output from the constant current sources flow in the array without any change, as constant currents IAX and IAY. Therefore, it is anticipated that the write current rises in no time. However, parasitic capacitors CLX, CLY, CX1, . . . , CXm, CY1, . . . , CYm are present in the actual circuit (in the case of m-row m-column array) as shown in FIG. 18. Even if the constant current sources let the constant currents ICX and ICY flow outside the array, a current in the array is dissipated to charge the parasitic capacitors especially immediately after the current is flowed. As a result, the current waveform becomes dull as shown in FIG. 19B. Especially in the case of the MRAM, a current having a specific value or less does not have writing capability and consequently it is necessary to wait until the current value reaches a necessary value. Therefore, fast writing becomes difficult and a wasteful current is caused as represented by a shaded portion in FIG. 19B. Especially in the case of the MRAM, therefore, there is a drawback that the power consumption increases because the write current value is large (several mA).

This problem becomes remarkable as the memory capacity becomes large. FIG. 20 is a block diagram showing a configuration used when currents are flowed through a large storage capacity array by using conventional constant current source circuits. The large storage capacity array is composed of N by M small arrays. In order to increase the area occupied by the memory, an X side current source conducts writing on M small arrays in the same row, and a Y side current source conducts writing on N small arrays in the same column. Therefore, as regards the X side write current for example, a current path 1 used when a current is flowed through a small array (1, 1) is different in length from a current path M used when a current is flowed through a small array (1, M). These current paths are accompanied by wire resistance Rp and parasitic capacitance Cp. Even if a constant current is flowed, therefore, a delay time substantially given by a time constant Δt=CpRp is caused. If a current path is different, it is a matter of course that wire resistance and parasitic capacitance are different, and a wire potential is different. Therefore, a charge amount required to charge the parasitic capacitance also becomes different. This difference will now be described with reference to FIG. 21. Denoting a terminating potential by V0, synthetic resistance of a small array 921 and a selector 922 by r, and synthetic parasitic capacitance of the small array 921 and the selector 922 by C, and supposing that a small array k (1<k<M) has been selected, the amount of charge stored on the parasitic capacitor when a current I flows is represented by the following equation.

$$Q_k = CV_0 + \sum_{j=1}^{k} C(V_0 + RjI) + C_A(V_0 + RkI) + \qquad (1)$$

$$\sum_{j=1}^{k} C(V_0 + RkI + rI + RjI) = ak^2 + bk + c$$

Here, $a = 2CRI$
$b = C(R + r)I + C_A RI + 2CV_0$
$c = (C + C_A)V_0$

The equation representing the amount of charge stored across the parasitic capacitor becomes a quadratic equation with respect to the array position k, and it becomes a linear equation with respect to the current value I.

However, the mere use of the conventional constant current source is not enough to minimize the influence of the parasitic capacitor which depends upon the place of the selection array and let a write current flow in a short time. Further since the capacitance of the parasitic capacitor depends on the write current value, it has been difficult to minimize the influence of the parasitic capacitor according to the actual current value and let a write current flow in a short time. Furthermore, since there is a possibility that the actually accompanying parasitic capacitor will differ according to the chip, it is difficult to minimize the influence of the parasitic capacitor and let a write current flow in a short time.

An object of the present invention is to shorten the write speed and reduce the power consumption by preventing the parasitic capacitor from prolonging the time required until the write current reaches a predetermined value.

In order to achieve the object, a semiconductor memory device according to the present invention has a configuration in which the write current source path includes a circuit (hereafter referred to as a boost circuit) that stores electric charge at the time of write standby and instantaneously releases the electric charge at the time of write operation. By using the boost circuit, the parasitic capacitors which are present on the wire and the selector gate can be charged instantaneously. As a result, the amount of charging the parasitic capacitors with a current flowing from a constant current source circuit which is present separately from the boost circuit can be decreased. As a result, it becomes possible for the write current to rise in a short time. Consequently, writing can be conducted in a short time, and the increase of power consumption can be prevented.

The boost circuit in the semiconductor memory device includes a plurality of boost capacitors and a capacitor selector. The capacitance can be selected according to the place of the cell array and the current value. Therefore, an effect is taken in writing into an arbitrary cell with an arbitrary current.

In addition, in the boost circuit in the present semiconductor memory device, the boost capacitor is divided in order to form a geometric progression according to a selection pattern. Therefore, all boost capacitors are used at the time of maximum boost (writing to the remotest array, with maximum current). As a result, waste does not occur in the area occupied by the boost capacitor and the area occupied by the array can be increased.

According to the present invention, there is provided a semiconductor memory device including a storage element for storing information, a constant current source for writing information into the storage element by flowing a current and a boost circuit for charging parasitic capacitors by a time when an amount of a current flowed by the constant current source reaches an amount of a current required to write information into the storage element, at a predetermined position related to the storage element.

In the semiconductor memory device, the storage element may be a tunnel magnetoresistance element, and the predetermined position may be a position, a current at which generates a magnetic field applied to the tunnel magnetoresistance element.

In the semiconductor memory device, the boost circuit may include a condenser for storing charge to charge the parasitic capacitors.

The semiconductor memory device may further include a circuit for setting a voltage between both electrodes of the condenser to a voltage greater than a power supply voltage.

In the semiconductor memory device, the condenser may be increased to a plurality of condensers, and the boost circuit may include switching means for selecting one or more condensers to be used for charging, according to an amount of charge required to charge the parasitic capacitors.

In the semiconductor memory device, the switching means may switch a combination of condensers to be used for charging, according to an amount of charge required to charge the parasitic capacitors.

In the semiconductor memory device, capacitances of at least a part of the condensers may be mutually related by a geometric progression.

In the semiconductor memory device, capacitances of at least a part of the condensers may be determined according to capacitances of the parasitic capacitors depending upon an amount of a current required to write information into the storage element.

In the semiconductor memory device, capacitances of at least a part of the condensers may be determined according to capacitances of the parasitic capacitors depending upon a position of the storage element.

In the semiconductor memory device, capacitances of at least a part of the condensers may be determined according to capacitances of the parasitic capacitors depending upon a process condition.

The semiconductor memory device according to the present invention includes returning means for returning at least a part of charge on parasitic capacitors which are present on a current path of a current for writing information into the storage element, to a node where charge of the boost circuit is stored. Therefore, an MRAM having low current dissipation can be obtained.

In the semiconductor memory device according to the present invention, a time when storing charge in the boost circuit is set at a time after completion of an operation period of the constant current source. Therefore, the constant current source circuit can be made to operate stably. In its turn, an MRAM having a high process yield can be obtained.

The semiconductor memory device according to the present invention includes retention means for retaining a part of charge on parasitic capacitors which are present on a current path of a current for writing information into the storage element, in dependence on history of an operation mode, so as to suppress discharge of the boost circuit. Therefore, an MRAM having low current dissipation can be obtained.

According to the present invention, charging from the power supply to the capacitor is conducted at the time of standby, and discharge of the charge stored on the capacitor is conducted at the time of operation. As a result, charging the parasitic capacitors is conducted in a short time and the write time can be shortened. In general, values of these parasitic capacitors depend on the position of the write cell and current value. However, the parasitic capacitors can be charged at a suitable speed by adding a plurality of capacitor arrays and a capacitor selector for selecting a suitable capacitor to the write constant current source circuit. In other words, fast writing can be implemented. In particular, therefore, the present invention takes a great effect in implementing an MRAM having a large storage capacity.

BRIEF DESCRIPTION OF DRAWINGS

FIG. 2 is a circuit diagram showing a configuration of a constant current source circuit used in the semiconductor memory device according to the first embodiment of the present invention;

FIGS. 4A and 4B are circuit diagrams showing examples of a boost circuit and a level shift circuit, respectively, used in the semiconductor memory device according to a second embodiment of the present invention;

FIG. 10 is a capacitance configuration diagram showing a method for dividing current boost capacitance in the third embodiment of the present invention;

FIG. 11 is a table showing a method for selecting current boost capacitance in the third embodiment of the present invention;

FIG. 16 is a diagram showing a structure of a TMR memory cell;

FIG. 21 is a circuit diagram showing influence of parasitic capacitors in a large storage capacity array.

BEST MODE FOR CARRYING OUT THE INVENTION

Hereafter, embodiments of the present invention will be described in detail with reference to the accompanying drawings in order to clarify the above described and other objects, features and advantages.

First Embodiment

A semiconductor memory device according to the first embodiment of the present invention will now be described.

Figure 1:
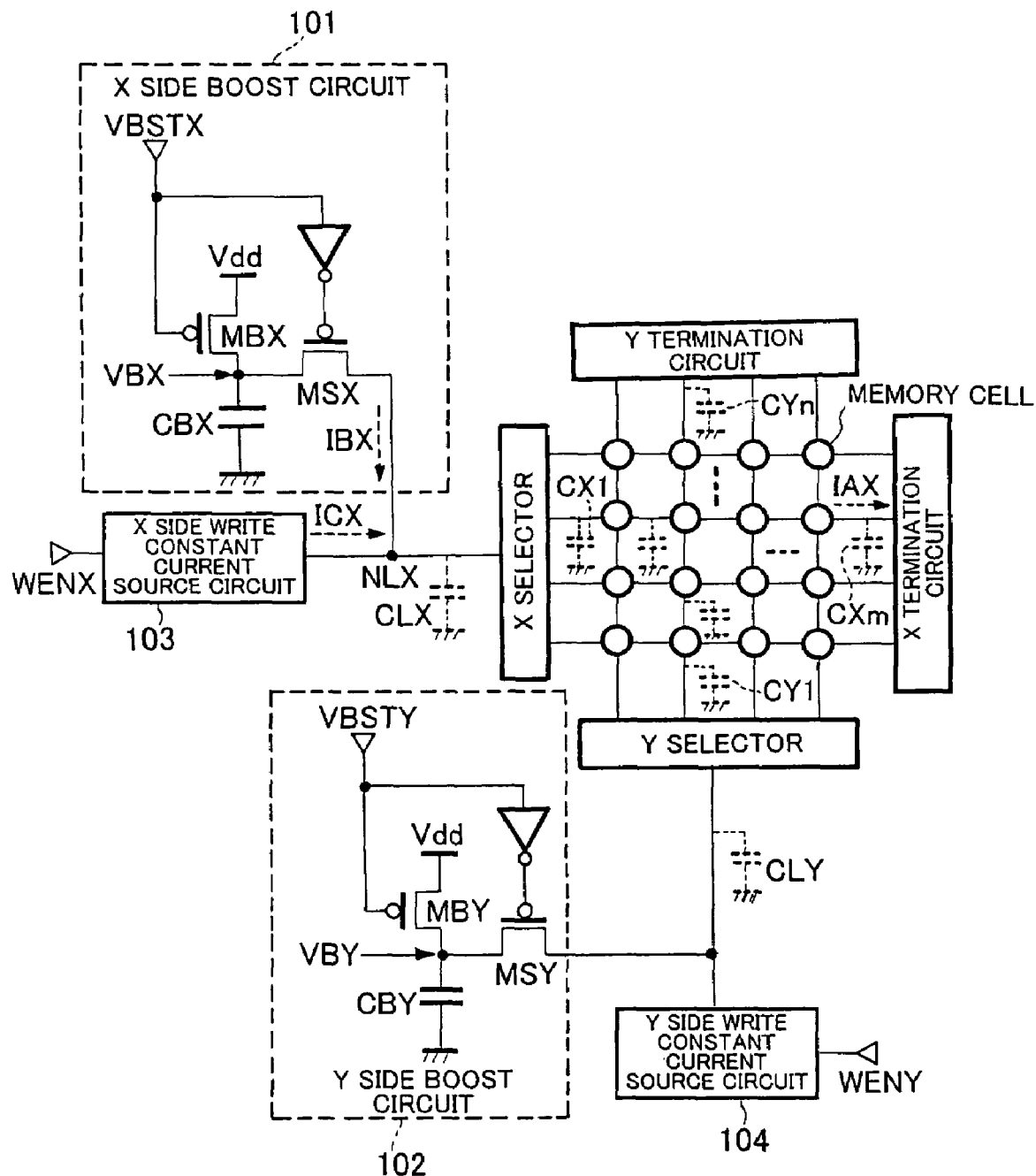
FIG. 1 is a block diagram showing a configuration of a semiconductor memory device according to a first embodiment of the present invention.

FIG. 1 is a block diagram showing a configuration of the semiconductor memory device according to the first embodiment of the present invention. In an X side boost circuit 101 shown in FIG. 1, one end of a boost capacitor CBX is connected to the ground and the other end thereof is connected to a PMOS transistor MSX and a PMOS transistor MBX via a terminal VBX. The other end of the PMOS transistor MBX is connected to a power supply voltage Vdd. At the time of boost standby (VBSTX=L level (GND)), the PMOS transistor MSX is in the off-state and the PMOS transistor MBX is in the on-state and consequently charge QB=CBX×Vdd is stored on the boost capacitor CBX. In a Y side boost circuit 102 as well, similar operation is conducted. Each of an X side write constant current circuit 103 and a Y side write constant current circuit 104 is a current source having a large output impedance, and is capable of letting a constant current flow without being affected by wire resistance or the like (The designated current value becomes the current value to be finally flowed through the cell array). The configuration of the write constant current circuits 103 and 104 can be implemented by, for example, forming a cascode connection of transistors as shown in FIG. 2. Input voltages Vb1 and Vb2 of gates of PMOS transistors are voltages capable of activating all transistors in the saturation region, and generated by a bias circuit. The current value can be set by switching selection switches SW1, . . . , SWn (logical product of a write start signal WENX and a current selection signal). In FIG. 2, n-bit binary current sources are included and consequently current values of $2^n$ ways, (i, 2i, 3i, . . . , ($2^n$-1)i) can be set.

Figure 3A:
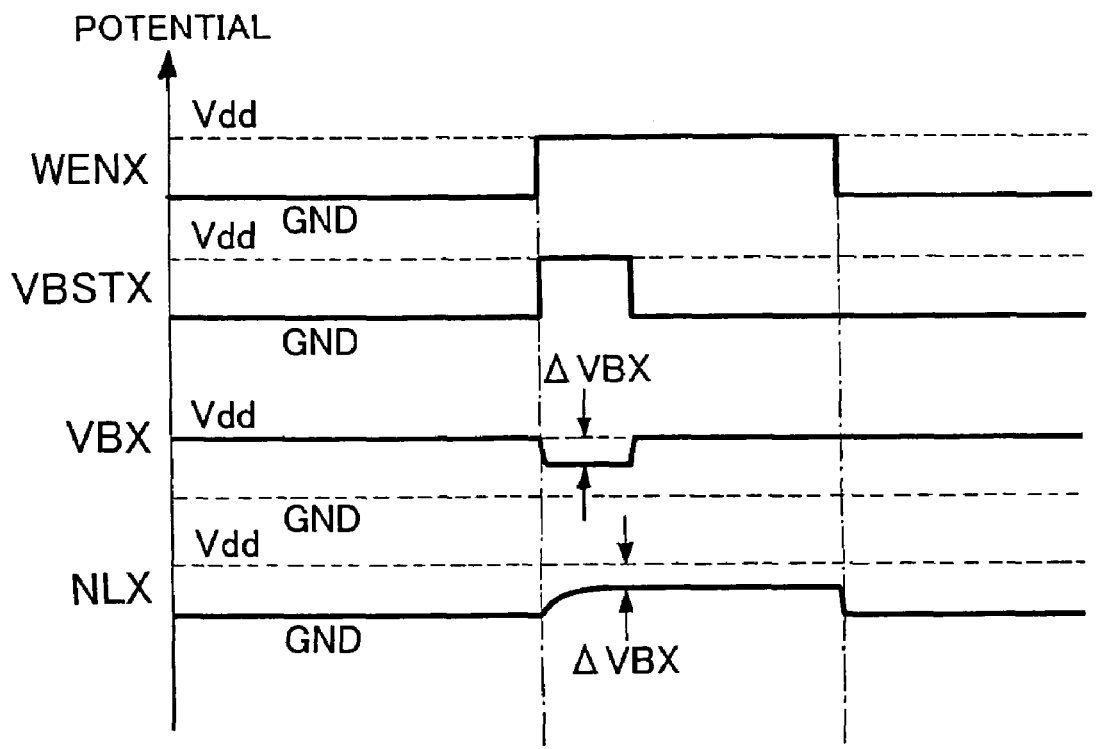
FIG. 3A is a timing chart showing operation of the semiconductor memory device conducted at the time of writing according to the first embodiment of the present invention.

Operation and effects of the constant current control circuit will now be described with reference to timing charts shown in FIGS. 3A and 3B. Mainly, operation of the X side will be described. It is evident that similar operation is conducted on the Y side as well.

If the constant current source circuit 103 the operation state and the signal WENX and the signal VBSTX are switched from the L level to the H level (Vdd), the PMOS transistor MBX turns off and the PMOS transistor MSX turns on. A potential at the node VBX is approximately equal to the power supply voltage Vdd. A potential on wire NLX is lower than to the power supply voltage Vdd, and it is equal to, for example, GND. Therefore, charge stored on the boost capacitor CBX abruptly flows through the selected wire. This current is an instantaneous overshoot current reflecting the discharge phenomenon, and flows for several nanoseconds while charging the parasitic capacitors CLX, CX1, . . . , CXm. If the potential at the node VBX soon becomes equal to the wire potential NLX, the flow of the boost current ceases. This situation is indicated by a current waveform IBX shown in FIG. 3B. While the signal VBSTX is at the H level, a potential drop of ΔVBX occurs at the node VBX. On the contrary, the potential NLX on the selected wire rises from the GND potential to Vdd-ΔVBX.

Figure 3B:
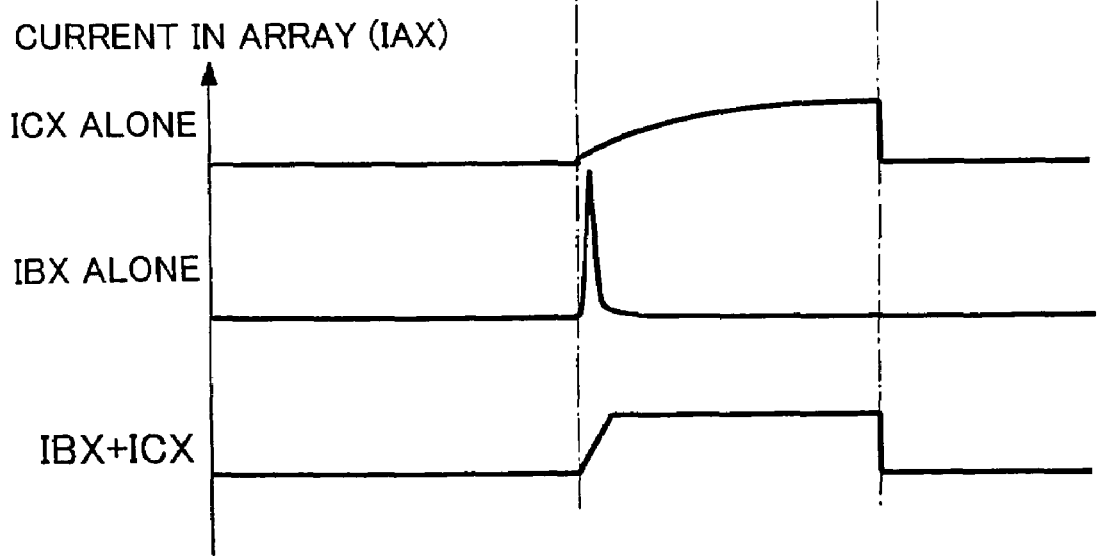
FIG. 3B is another timing chart showing operation of the semiconductor memory device conducted at the time of writing according to the first embodiment of the present invention.

If the boost circuit 101 were off, a current from the X side write constant current source circuit 103 would flow into the parasitic capacitor, and therefore, a rising edge of the current IAX at the wire terminus would become dull (see IAX shown in FIG. 3B). On the other hand, because the boost circuit 101 is on, the parasitic capacitor can be charged by the boost current IBX as described above and consequently the dullness in the current waveform decreases. If the capacitance of the boost capacitor CBX is adjusted to a proper value in the design, the current IAX=ICX+IBX that actually flows through the cell array can be made to rise in a short time (approximately 2 nanoseconds) as shown in the bottom row in FIG. 3B. Therefore, writing is completed in a short time, and the power consumption can be prevented from being increased.

Second Embodiment

A semiconductor memory device according to the second embodiment of the present invention will now be described. The second embodiment aims at further shortening the write time by boosting the voltage applied to the boost capacitors CBX and CBY described in the first embodiment, thereby increasing the amount of charge that can be stored. Furthermore, according to the present circuit configuration, the amount of charge per unit area of capacitor stored on the boost capacitors CBX and CBY becomes large. This results in an advantage that the area of the boost capacitors CBX and CBY can be made small.

First, operation of the boost circuit will now be described with reference to FIG. 4A. It is supposed that the threshold voltage of a diode is Vt. At the time of standby, a potential at an input terminal A1 is V(A1)=0, a potential at an output terminal VBT is V(VBT)=Vdd-2Vt, and a potential at a node A2 is V(A2)=Vdd-Vt. If V(A1) is changed to V(A1)=Vdd in this state, the potential V(A2) at the node A2 attempts in a moment to rise to 2Vdd-Vt due to coupling of a capacitor $C_B$ (Since discharging is conducted through a diode D2 at the same time, however, the actual potential is lower than 2Vdd-Vt or less). As a result, the diode D1 turns off and the diode D2 turns on, and a stabilizing capacitance $C_L$ is charged. Accordingly, the output voltage VBT rises. If V(A1) becomes V(A1)=GND, the potential at the node A2 falls to near GND for a moment. As a result, the diode D1 turns on and D2 turns off. The capacitor $C_B$ is charged until V(A2)=Vdd-Vt is attained. In the same way, if a periodic pulse voltage is input to the node A1, the stabilizing capacitance $C_B$ is charged when V(A1)=GND, and discharged when V(A1)=Vdd. Eventually, a current flows from A2 to the output terminal VBT to charge the stabilizing capacitance $C_L$ until V(A2)-Vt=VBT is attained. The output potential at this time becomes VBT=2Vdd-2Vt.

Operation of the level shift circuit will now be described with reference to FIG. 4B. When an input terminal IN is at the L level in a level shift circuit shown in FIG. 4B, an NMOS transistor MN1 and a PMOS transistor MP2 are in the on-state whereas an NMOS transistor MN2 and a PMOS transistor MP1 are in the off-state, and therefore, an output potential OUT becoming the L level. On the other hand, when the input terminal IN is at the H level, the NMOS transistor MN2 and the PMOS transistor MP1 are in the on-state whereas the NMOS transistor MN1 and the PMOS transistor MP2 are in the off-state, and therefore, the output potential OUT becoming the VBT. In other words, level conversion from Vdd to VBT is conducted.

Figure 5:
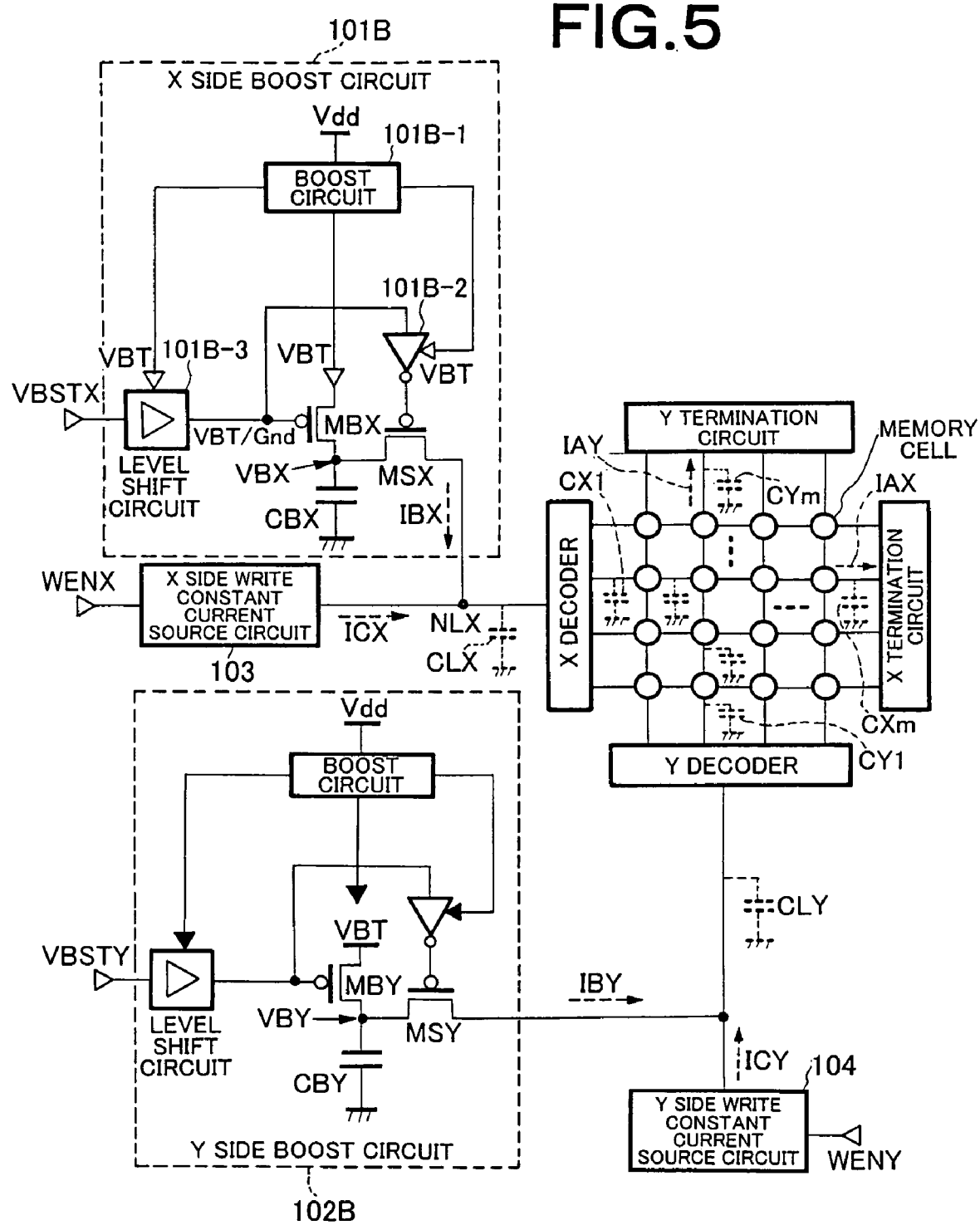
FIG. 5 is a block diagram showing a configuration of a semiconductor memory device according to a second embodiment of the present invention.

FIG. 5 is a block diagram showing a configuration of a semiconductor memory device according to the second embodiment. In an X side boost circuit 101B shown in FIG. 5, one end of a boost capacitor CBX is connected to the ground and the other end thereof is connected to PMOS transistors MSX and MBX via a terminal VBX. The other end of the PMOS transistor MBX is connected to a boosted voltage VBT obtained by boosting a power supply voltage Vdd in a boost circuit 101B-1. It is necessary to make gate voltages of the PMOS transistors MSX and MBX equal to the VBT in order to prevent a current from leaking at the time of off. Therefore, a power supply voltage of an inverter 101B-2 for controlling a gate voltage of the PMOS transistors MSX is set equal to the VBT, and an input voltage at the gate of the PMOS transistor MBX is set to VBT obtained by converting Vdd in the level shift circuit 101B-3. At the time of boost standby (VBSTX=L level), the PMOS transistor MSX is in the off-state and the PMOS transistor MBX is in the on-state, and consequently charge QB=CBX×VBT is stored in the boost capacitor CBX. In a Y side boost circuit 102B as well, similar operation is conducted. Each of an X side write constant current circuit 103 and a Y side write constant current circuit 104 is a current source having a large output impedance, and is capable of letting a constant current flow without being affected by wire resistance or the like (The designated current value becomes the current value to be finally flowed through the cell array). The configuration of the write constant current circuits 103 and 104 can be implemented by, for example, forming a cascode connection of transistors as shown in FIG. 2.

Figure 6A:
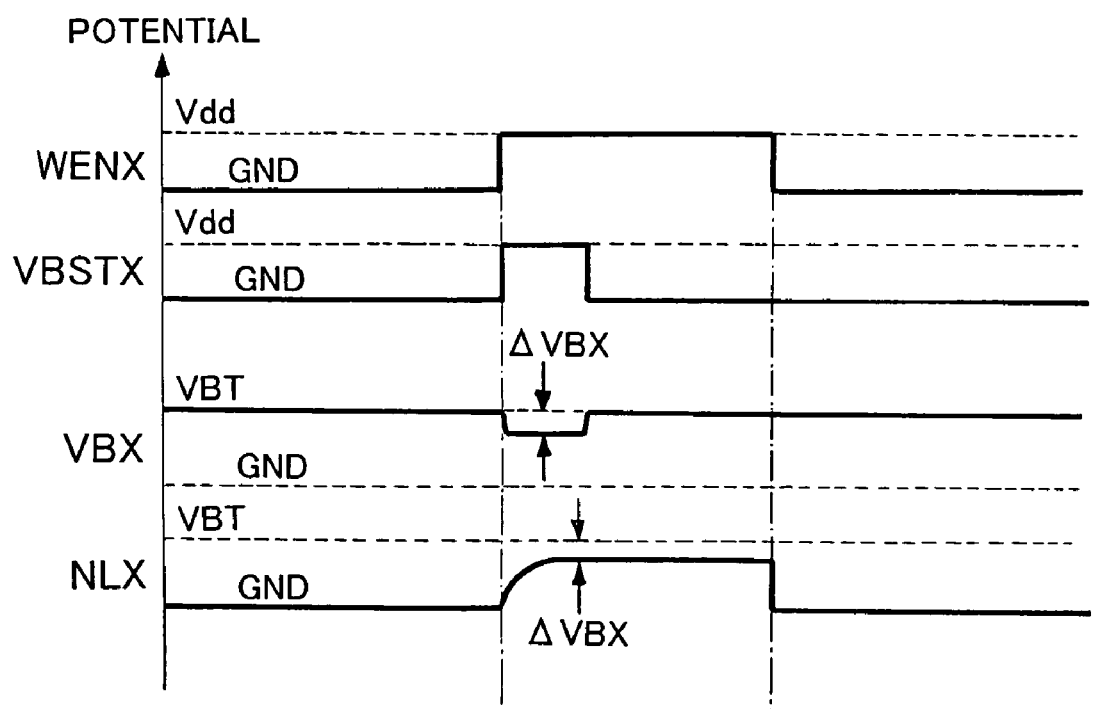
FIG. 6A is a timing chart showing operation of the semiconductor memory device conducted at the time of writing according to the second embodiment of the present invention.

Operation of the present circuit will now be described with reference to timing charts shown in FIGS. 6A and 6B. Mainly, operation of the X side will be described. It is evident that similar operation is conducted on the Y side as well.

If the constant current source circuit 103 enters the operation state and a write start signal WENX and a boost start signal VBSTX are switched from the L level to the H level, the PMOS transistor MBX turns off and the PMOS transistor MSX turns on. A potential at the node VBX immediately before the switching is approximately equal to a boosted voltage VBT. A potential on wire NLX is lower than the VBT, and it is equal to, for example, the ground potential. The moment MSX turns on, therefore, charge stored in the boost capacitor CBX abruptly flows through the selected wire. This current is an instantaneous overshoot current and flows for several nanoseconds while charging parasitic capacitors CLX, CX1, . . . , CXm. If the potential at the node VBX soon becomes equal to the wire potential NLX, the flow of the boost current ceases. This situation is indicated by current waveforms shown in FIG. 6B. While the signal VBSTX is at the H level, a potential drop of ΔVBX occurs at the node VBX. On the contrary, the potential NLX on the selected wire rises from the GND potential to VBT-ΔVBX.

Figure 6B:
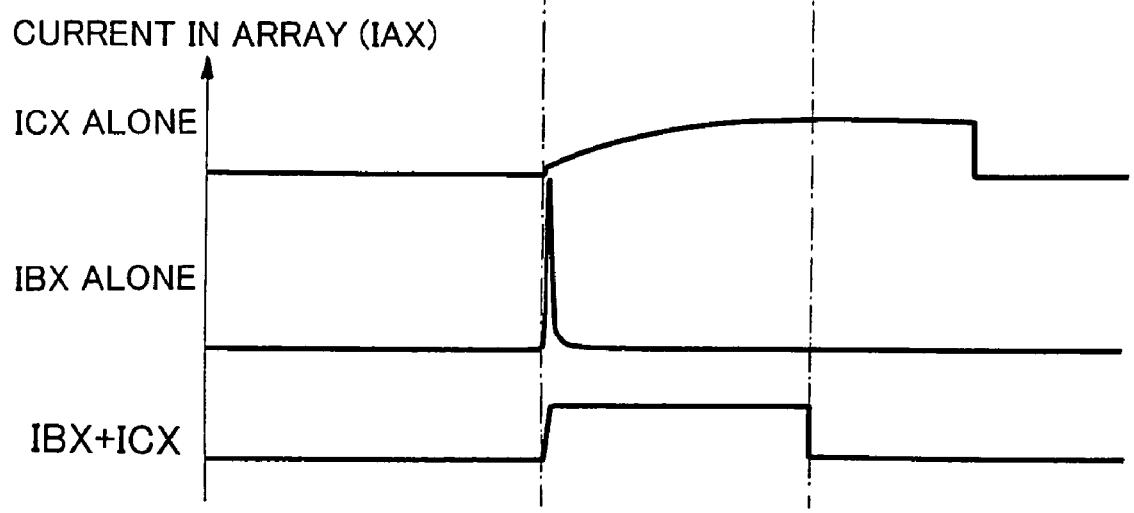
FIG. 6B is another timing chart showing operation of the semiconductor memory device conducted at the time of writing according to the second embodiment of the present invention.

If the boost circuit 101B were off, a current from the X side write constant current source circuit 103 would flow into the parasitic capacitor, and therefore, a rising edge of the current IAX in the array would become dull (see FIG. 6B). On the other hand, because the boost circuit 101B is on, the parasitic capacitor can be charged by the boost current IBX as described above and consequently the dullness in the current waveform decreases. If the capacitance of the boost capacitor CBX is adjusted to a proper value in the design, the current IAX=ICX+IBX that actually flows through the cell array can be made to rise in a short time (approximately 2 nanoseconds) as shown in the bottom row in FIG. 6B. Therefore, writing is completed in a short time, and the power consumption can be prevented from being increased.

Third Embodiment

A semiconductor memory device according to the third embodiment of the present invention will now be described.

Figure 7:
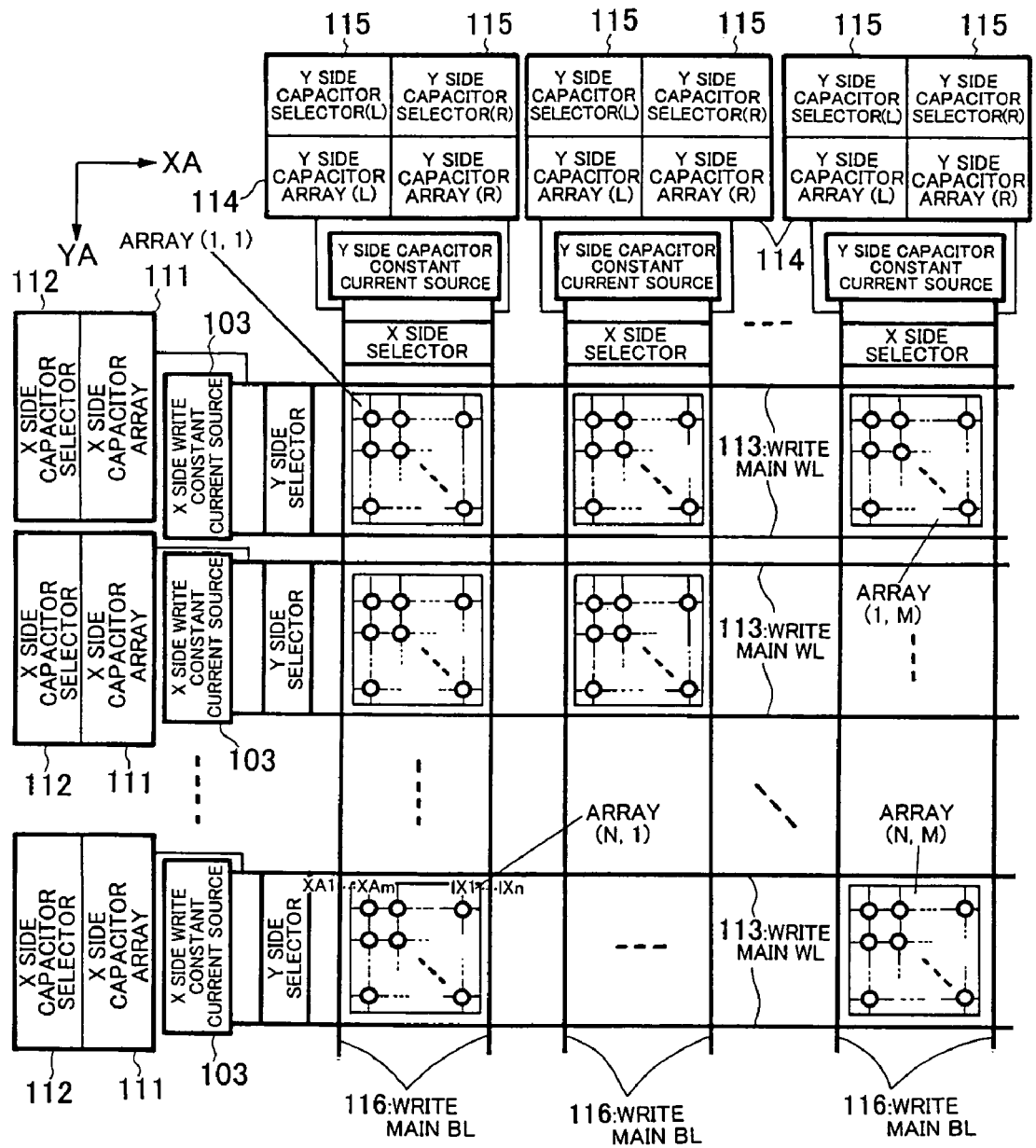
FIG. 7 is a block diagram showing a configuration of a semiconductor memory device according to a third embodiment of the present invention.
Figure 20:
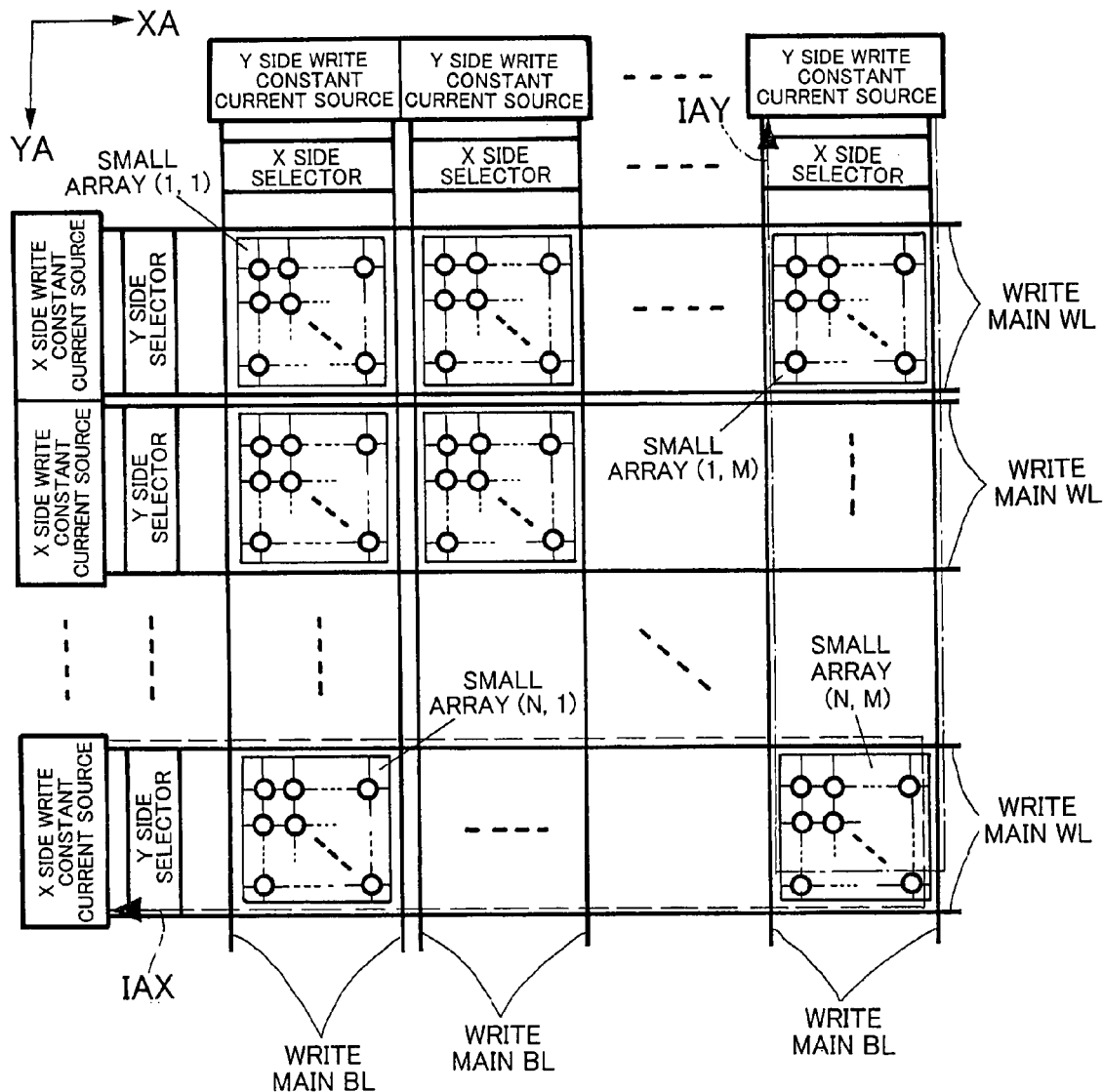
FIG. 20 is a block diagram showing a configuration of the conventional semiconductor memory device.

In the third embodiment, a current boost circuit is applied to the large storage capacity array shown in FIG. 20. A write circuit diagram used in this embodiment is shown in FIG. 7. An X side current boost capacitor array 111 and an X side capacitor selector 112 are connected to X side main wire 113. A Y side current boost capacitor array 114 and a Y side capacitor selector 115 are connected to Y side main wire 116. This is a feature of the third embodiment. Write switching between "0" and "1" is conducted by switching the Y side write current direction. In order to make it possible to add a boost current to the write current of both directions, capacitor arrays and capacitor selectors of two systems (represented as L and R) are prepared on the Y side. Since X side write operation is basically the same as the Y side write operation, only the X side writing will be described hereafter.

It is supposed that an X side write constant current source 103 shown in FIG. 7 can output current values of n ways, i.e., IX1, IX2, . . . , IXn. The reason is as follows. The magnetization reversal current of the MRAM varies according to the process condition or the like. Therefore, there is a possibility that the designed current value is not necessarily an optimum current value. Accordingly, it is necessary to adjust the current value at the time of manufacture and shipping. That is the reason. Since the amount Qk of charge stored in the parasitic capacitor changes according to the equation (1) depending upon the write current values of n ways, therefore, it is also necessary to prepare current boost capacitors of n ways. M small arrays XA1, . . . , XAM are arranged in the X direction. In addition, the amount Qk of chare stored in the parasitic capacitor changes according to the equation (1) depending upon the X direction write array position k (k=1, 2, . . . , M) as well. Therefore, it is also necessary to prepare current boost capacitors of M ways. Further, since there is a possibility that the actual parasitic capacitor will differ from the design value, it is necessary to correct the current boost amount and to prepare boost capacitors of s ways for this purpose. If the X side capacitor array 111 in each row shown in FIG. 7 is formed of M×n×s capacitors to satisfy the needs heretofore described, there is a fear that the area occupied by the current boost capacitor will become enormous.

Figure 8:
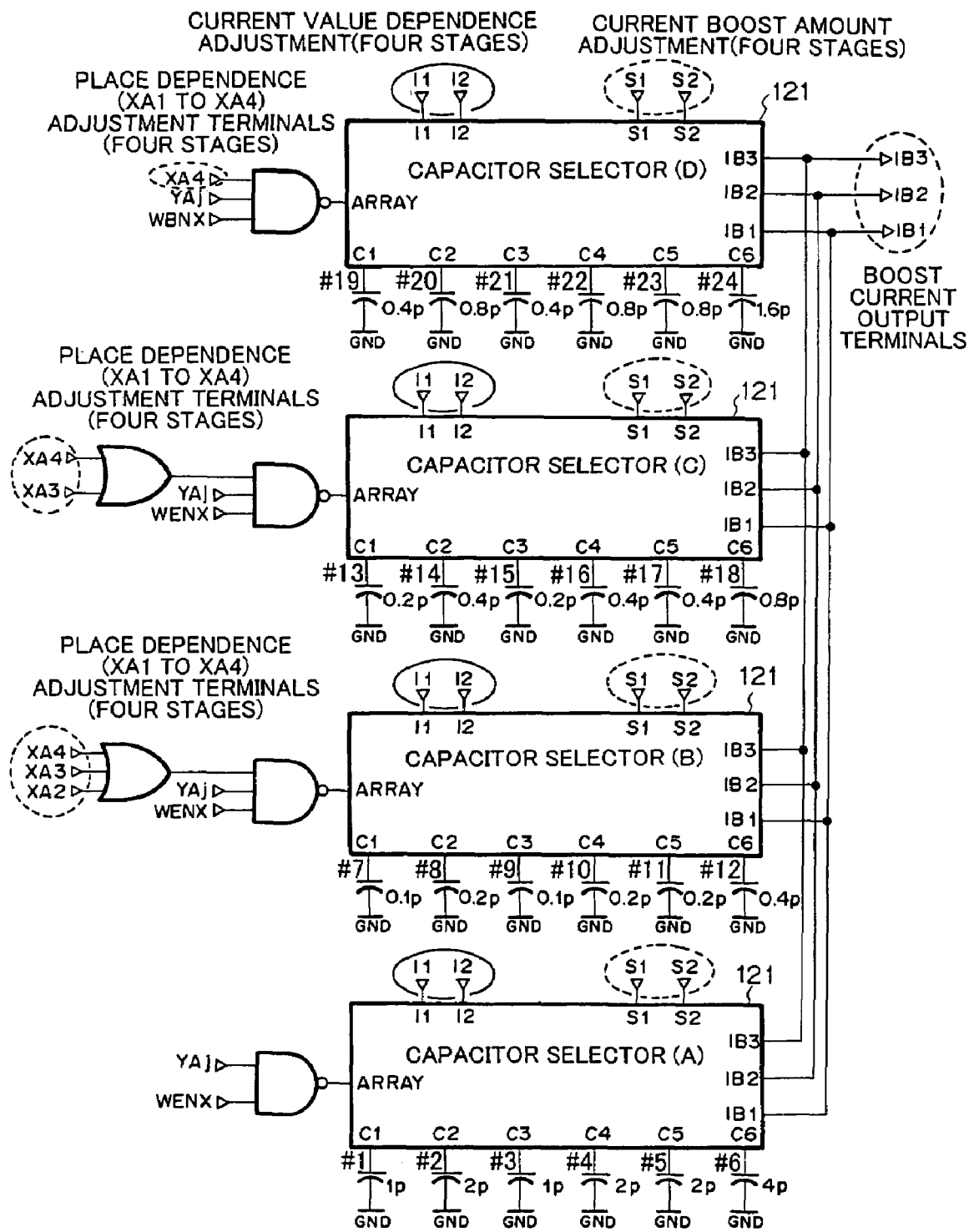
FIG. 8 is a block diagram showing a configuration of a boost circuit used in the semiconductor memory device according to the third embodiment of the present invention.

However, if such a structure that the charge on all boost capacitors are used at the time of maximum boost (when the current is maximum, the remotest array is selected, and the correction boost amount is maximum) is adopted and capacitors are made to have relations represented by a geometric progression so as to be able to approximate the equation (1) of parasitic capacitors, then it is possible to decrease the number of boost capacitors, and hence the area occupied by the boost capacitor can be made small. For example, in the present embodiment, FIG. 8 shows the X side capacitor array and blocks of the X side capacitor selectors (As for the Y side as well, a similar configuration is possible). The block shown in FIG. 8 is prepared every row of the array. Here, the number of X direction write array positions=4, the number of current values=4, and the number of correction values s=4.

Since the number of X direction write array positions is set to M=4, capacitance of the boost capacitor is adjusted by using terminals XA2 to XA4. When the write start signal WENX becomes the H level with an array having 1 as the X direction position and j as the Y direction position being selected, capacitors #1 to #6 connected to a capacitor selector (A) become capacitors of candidates for use as evident from the configuration of logic gates which control a terminal "ARRAY" shown in FIG. 8. When the write start signal WENX becomes the H level with an array having 2 as the X direction position and j as the Y direction position being selected, capacitors #1 to #6 connected to the capacitor selector (A) and capacitors #7 to #14 connected to a capacitor selector (B) become capacitors of candidates for use. When the write start signal WENX becomes the H level with an array having 3 as the X direction position and j as the Y direction position being selected, capacitors #1 to #6 connected to the capacitor selector (A), capacitors #7 to #14 connected to the capacitor selector (B) and capacitors #13 to #18 connected to the capacitor selector (C) become capacitors of candidates for use. When the write start signal WENX becomes the H level with an array having 4 as the X direction position and j as the Y direction position being selected, capacitors #1 to #6 connected to the capacitor selector (A), capacitors #7 to #14 connected to the capacitor selector (B), capacitors #13 to #18 connected to the capacitor selector (C) and capacitors #19 to #24 connected to the capacitor selector (D) become capacitors of candidates for use.

Since the number of current values is set to n=4, capacitors to be actually used are selected from capacitors connected to each capacitor selector by using terminals I1 and I2. Since the number of correction values is set to s=4, capacitors to be actually used are selected from capacitors connected to each capacitor selector by using terminals S1 and S2. Putting them together, capacitors to be actually used are selected from capacitors connected to each capacitor selector by using terminals I1, I2, S1 and S2. As for boost capacitors, there are boost capacitors #1 to #24. Therefore, the total number of boost capacitors is 24. As compared with M×n×s=4×4×4=64, it is appreciated that the number of boost capacitors has been reduced. Boost current output terminals of each capacitor selector are IB1, IB2 and IB3, and they are connected to X side main wire 113 (corresponding to the wire NLX). Therefore, currents output from the terminals IB1, IB2 and IB3 are added to the adjusted constant current output from the X side constant current source 103. Although transistor sizes in the capacitor selectors (A) to (D) are not especially prescribed in FIG. 8, it is easy to adjust the gate width of MBXj and MSXj (j=1, . . . , 6) (see FIG. 9) according to the size of the current boost capacitor.

Figure 9:
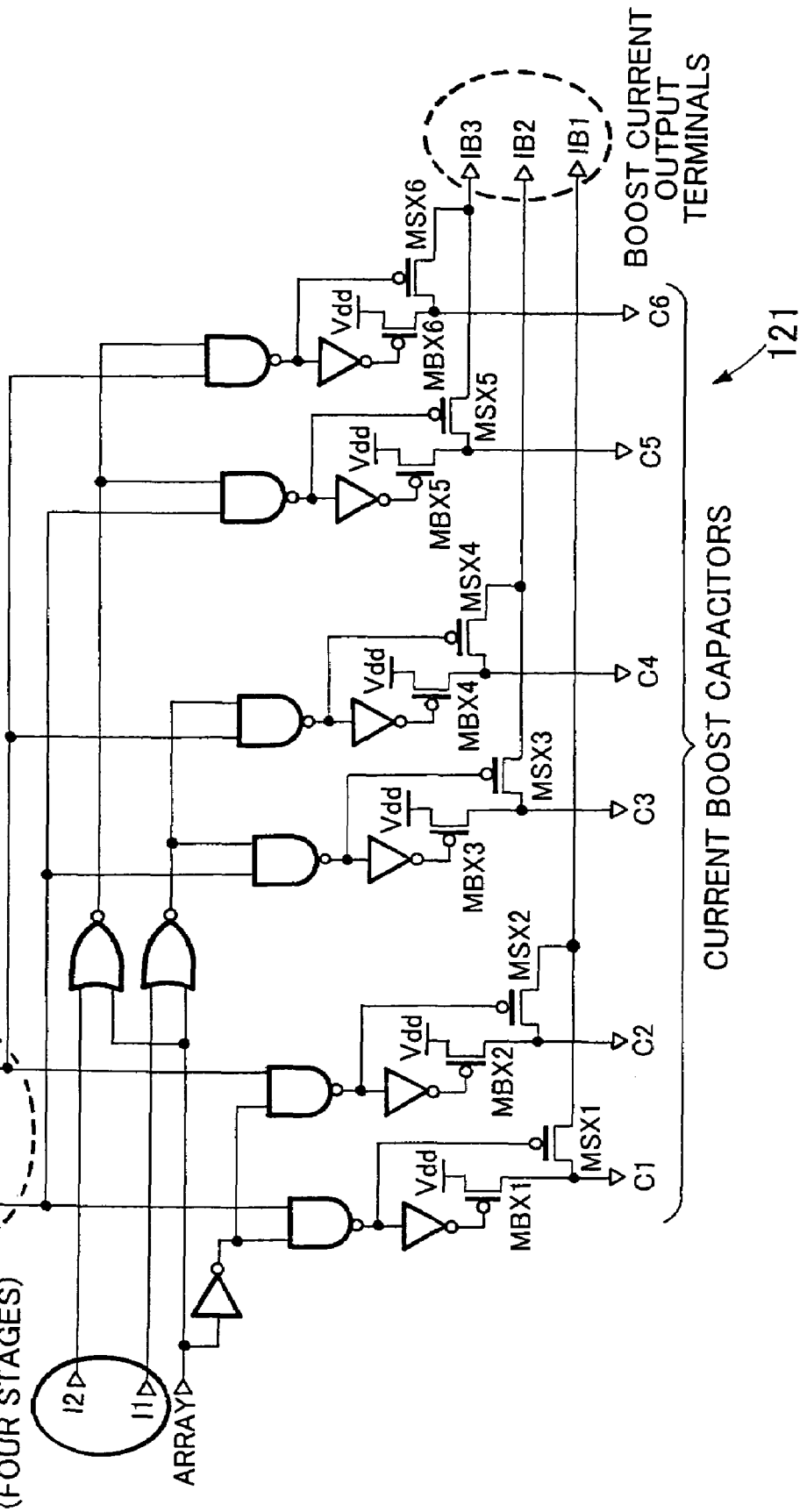
FIG. 9 is a circuit diagram showing a configuration of a capacitor selector included in the boost circuit shown in FIG. 8.

Each capacitor selector 121 is shown in FIG. 9, and the capacitor array is shown in FIG. 10. An "ARRAY" terminal in FIG. 9 corresponds to an "ARRAY" terminal shown in FIG. 8.

"I1" and "I2" terminals in FIG. 9 respectively correspond to "I1" and "I2" terminals shown in FIG. 8, and they are used to adjust the boost amount according to the equation (1) depending upon the values of adjusted write constant currents. For example, when I1=L and I2=L, a boost capacitor (#1, #7, #13 or #19) connected to an output terminal C1 and a boost capacitor (#2, #8, #14 or #20) connected to an output terminal C2 in FIG. 9 become candidates for selection. When I1=H and I2=L, the boost capacitor (#1, #7, #13 or #19) connected to the output terminal C1, the boost capacitor (#2, #8, #14 or #20) connected to the output terminal C2, a boost capacitor (#3, #9, #15 or #21) connected to an output terminal C3, and a boost capacitor (#4, #10, #16 or #22) connected to an output terminal C4 in FIG. 9 become candidates for selection. When I1=L and I2=H, the boost capacitor (#1, #7, #13 or #19) connected to the output terminal C1, the boost capacitor (#2, #8, #14 or #20) connected to the output terminal C2, a boost capacitor (#5, #11, #17 or #23) connected to an output terminal C5 and a boost capacitor (#6, #12, #18 or #24) connected to an output terminal C4 in FIG. 9 become candidates for selection. When I1=H and I2=H, the boost capacitor (#1, #7, #13 or #19) connected to the output terminal C1, the boost capacitor (#2, #8, #14 or #20) connected to the output terminal C2, the boost capacitor (#3, #9, #15 or #21) connected to the output terminal C3, the boost capacitor (#4, #10, #16 or #22) connected to the output terminal C4, the boost capacitor (#5, #11, #17 or #23) connected to the output terminal C5 and the boost capacitor (#6, #12, #18 or #24) connected to the output terminal C6 in FIG. 9 become candidates for selection.

"S1" and "S2" terminals in FIG. 9 correspond to the "S1" and "S2" terminals shown in FIG. 8 and are used to compensate the dependence of the charge Qk stored in the parasitic capacitor upon the process condition. For example, when S1=L and S2=L, any boost capacitor is not selected. When S1=H and S2=L, the boost capacitor (#1, #7, #13 or #19) connected to the output terminal C1, the boost capacitor (#3, #9, #15 or #21) connected to the output terminal C3 and the boost capacitor (#5, #11, #17 or #23) connected to the output terminal C5 in FIG. 9 become candidates for selection. When S1=L and S2=H, the boost capacitor (#2, #8, #14 or #20) connected to the output terminal C2, the boost capacitor (#4, #10, #16 or #connected to the output terminal C4, and the boost capacitor (#6, #12 #18 or #24) connected to an output terminal C6 in FIG. 9 become candidates for selection. When S1=H and S2=H, the boost capacitor (#1, #7, #13 or #19) connected to the output terminal C1, the boost capacitor (#2, #8, #14 or #20) connected to the output terminal C2, the boost capacitor (#3, #9, #15 or #21) connected to the output terminal C3, the boost capacitor (#4, #10, #16 or #22) connected to the output terminal C4, the boost capacitor (#5, #11, #17 or #23) connected to the output terminal C5, and the boost capacitor (#6, #12, #18 or #24) connected to the output terminal C6 in FIG. 9 become candidates for selection.

"S1" and "S2" terminals in FIG. 9 correspond to the "S1" and "S2" terminals shown in FIG. 8 and are used to compensate the dependence of the parasitic capacitor Qk upon the process condition. For example, when S1=L and S2=L, any boost capacitor is not selected. When S1=H and S2=L, the boost capacitor (#1, #7, #13 or #19) connected to the output terminal C1, the boost capacitor (#3, #9, #15 or #21) connected to the output terminal C3 and the boost capacitor (#5, #11, #17 or #23) connected to the output terminal C5 in FIG. 9 become candidates for selection. When S1=L and S2=H, the boost capacitor (#2, #8, #14 or #20) connected to the output terminal C2, the boost capacitor (#4, #10, #16 or #22) connected to the output terminal C4, and the boost capacitor (#6, #12 #18 or #24) connected to an output terminal C6 in FIG. 9 become candidates for selection. When S1=H and S2=H, the boost capacitor (#1, #7, #13 or #19) connected to the output terminal C1, the boost capacitor (#2, #8, #14 or #20) connected to the output terminal C2, the boost capacitor (#3, #9, #15 or #21) connected to the output terminal C3, the boost capacitor (#4, #10, #16 or #22) connected to the output terminal C4, the boost capacitor (#5, #11, #17 or #23) connected to the output terminal C5, and the boost capacitor (#6, #12, #18 or #24) connected to the output terminal C6 in FIG. 9 become candidates for selection.

Boost capacitors obtained by taking logical products of selection candidates of the three kinds described above are actually used. In other words, optimum boost capacitors are selected by a combination of XAj (j=(1), 2, . . . , 4), I1, I2, S1 and S2. All combinations are shown in FIG. 11. In FIG. 11, I(j)=I(I1+2×I2), A(j)=XAj, S(j)=S(S1+2×S2). (In order to express numerically, however, L=0 and H=1 are assumed.) For example, when I1=1 and I2=0, I(j)=I(1+2×0)=I(1) is obtained. At the time of XA1, A(j)=A(1) is obtained. When S1=1 and S2=0, S(j)=S(1+2×0)=S(1) is obtained.

As for capacitances, there are 24 capacitances #1 to #24, and the capacitor region is divided as shown in FIG. 10. The sum total of the capacitances is 20.4 pF, and all boost capacitors are used at the time of maximum boost (described above). In the case where a boost capacitor is prepared for each of (the number of small arrays M)×(n ways of current value)×(4 ways of boost adjustment)=4×4×4=64 ways, the sum total 306.8 pF of capacitances shown in FIG. 11 becomes necessary. In other words, the area in use can be reduced to approximately 6.6% in this embodiment.

Referring to FIG. 10, the relation "width of #1+#2: width of #3+#4: width of #5+#6=1:1:2" is obtained. The width of #3+#4 and the width of #5+#6 are related by a geometric progression. Since the width of #1: the width of #2=1:2, the width of #1 and the width of #2 are related by a geometric progression. Since the width of #3: the width of #4=1:2, the width of #3 and the width of #4 are related by a geometric progression. Since the width of #5: the width of #6=1:2, the width of #5 and the width of #6 are related by a geometric progression. Since height of #1: height of #7: height of #13: height of #19=4:1:2:4, the height of #7, the height of #13 and the height of #19 are related by a geometric progression.

Figure 12A:
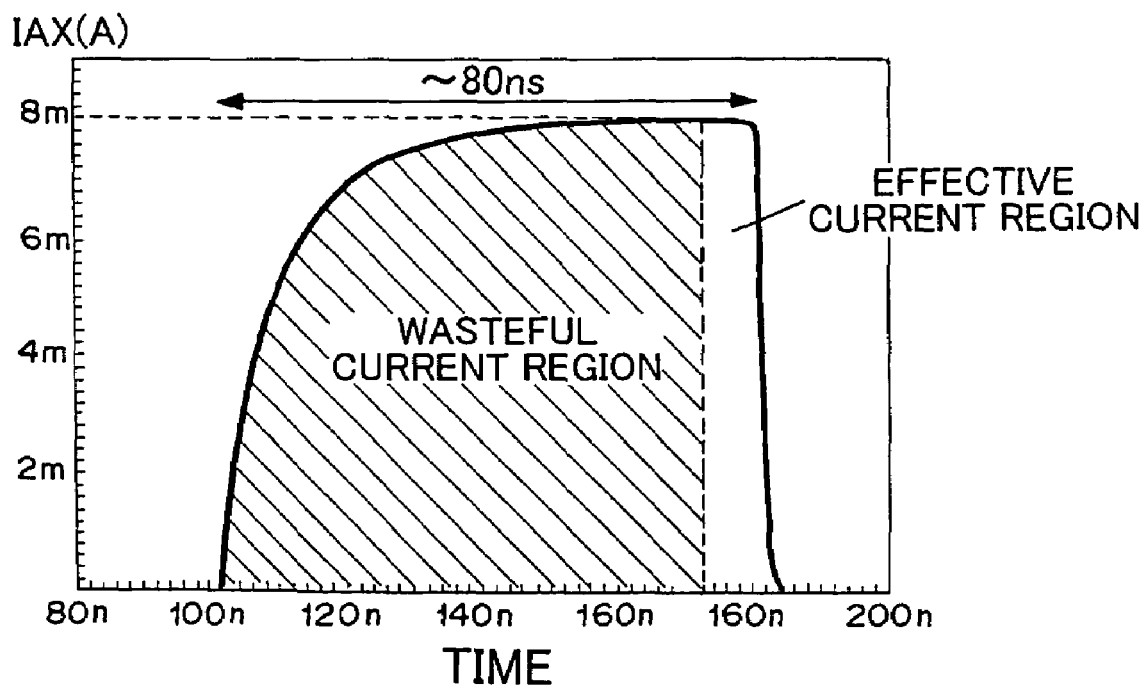
FIGS. 12A and 12B are comparative diagrams of a current simulation waveform showing an effect of the present invention.
Figure 12B:
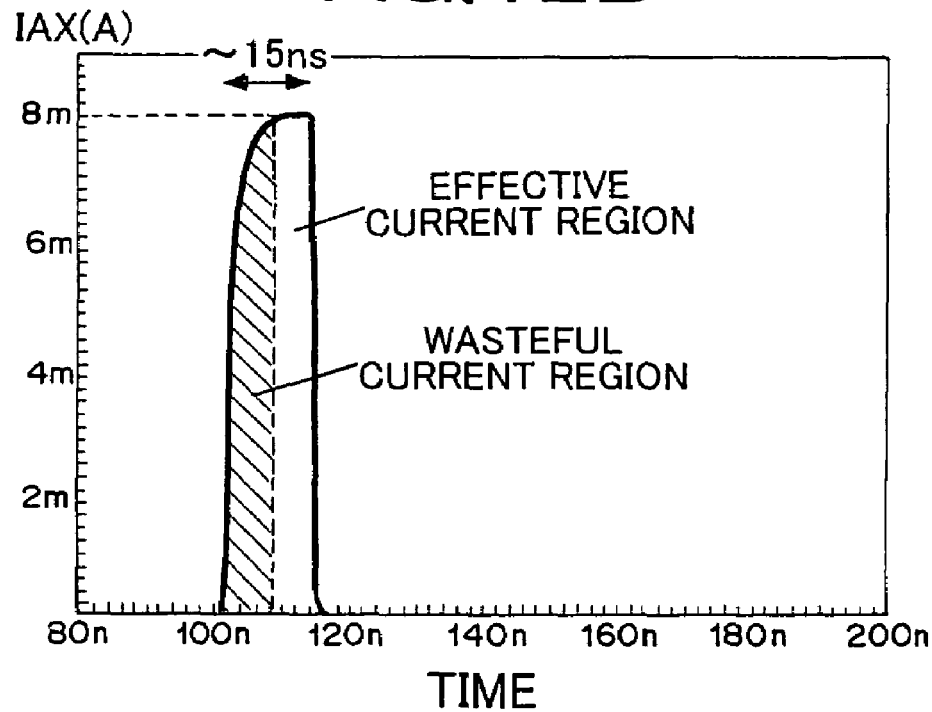

FIGS. 12A and 12B show a result of simulation obtained when a write current having a designated value of 8 mA is flowed through an MRAM cell array having a capacity of 1 Mbits. When a write current of 8 mA has continued for 6 nanoseconds, writing into a write cell is conducted. When a write current is less than 8 mA, however, writing into the write cell cannot be conducted. It is supposed that the write time after the current value has reached 8 mA is 5 nanoseconds. In the case where the boost circuit is not used (FIG. 12A), the time of approximately 80 nanoseconds is needed as the time over which the write current is flowed. In this case, approximately 70% (a shaded region) is a wasteful current. On the other hand, in the case where a proper boost current is used (FIG. 12B), the write time can be shortened to approximately 15 nanoseconds and the wasteful current is approximately 40% (a shaded region). If the boost amount is large, however, a current greater or equal to the desired current (here, 8 mA) flows and causes false writing. Therefore, accurate design of the capacitance is necessary. In the case of the present invention, the boost amount can be adjusted by using the capacitance adjustment terminals shown in FIG. 9.

Fourth Embodiment

A semiconductor memory device according to a fourth embodiment of the present invention will now be described.

Figure 13:
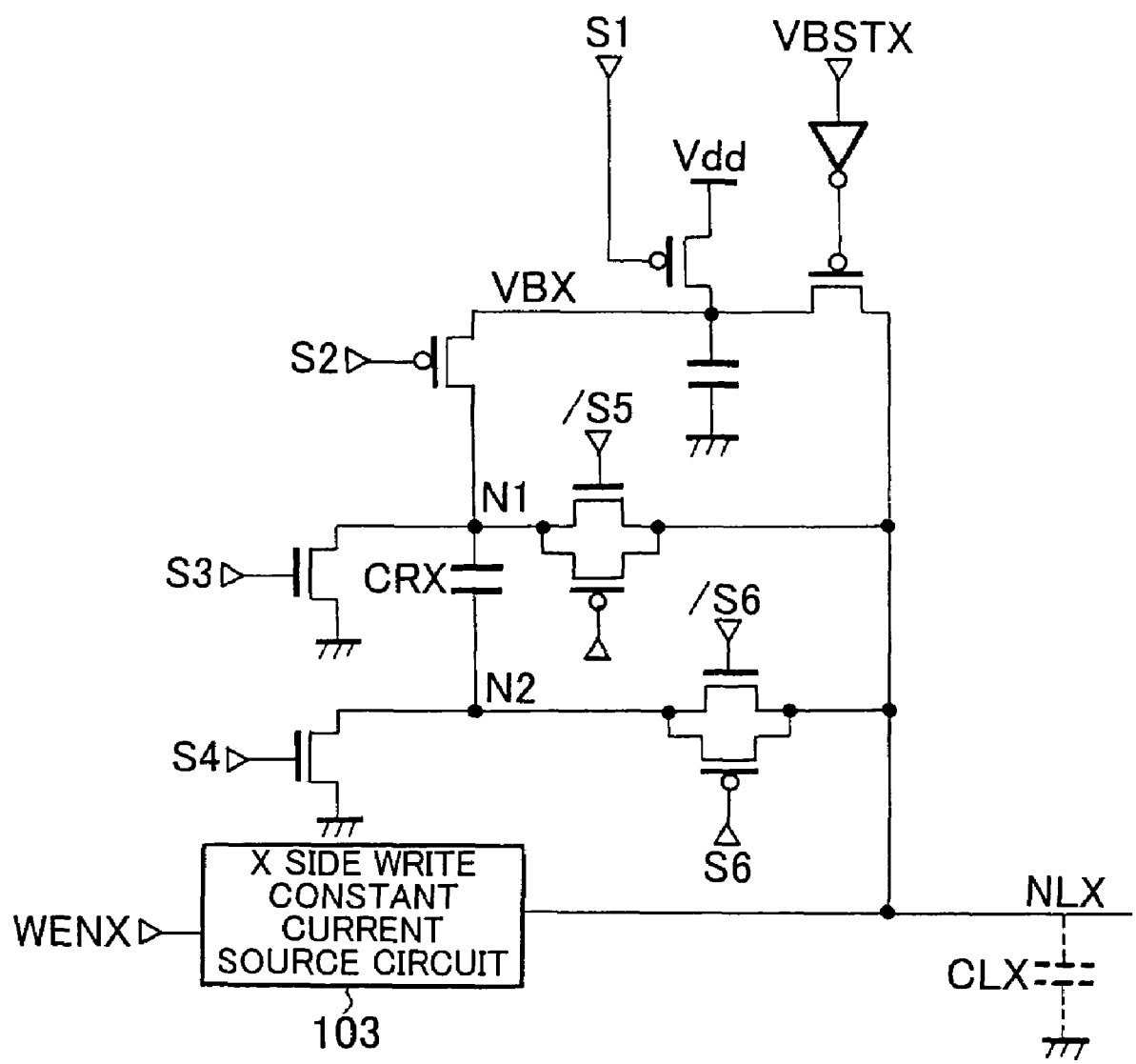
FIG. 13 is a block diagram showing a configuration of a semiconductor memory device according to a fourth embodiment of the present invention.

A circuit diagram of a boost circuit 101 according to a fourth embodiment of the present invention is shown in FIG. 13. In FIG. 13, only a circuit of X side is taken out in order to facilitate the description. S1 to S6 denote signals, and /S5 and /S6 denote inverted signals of S5 and S6, respectively. N1 and N2 represent potentials at nodes.

Figure 14:
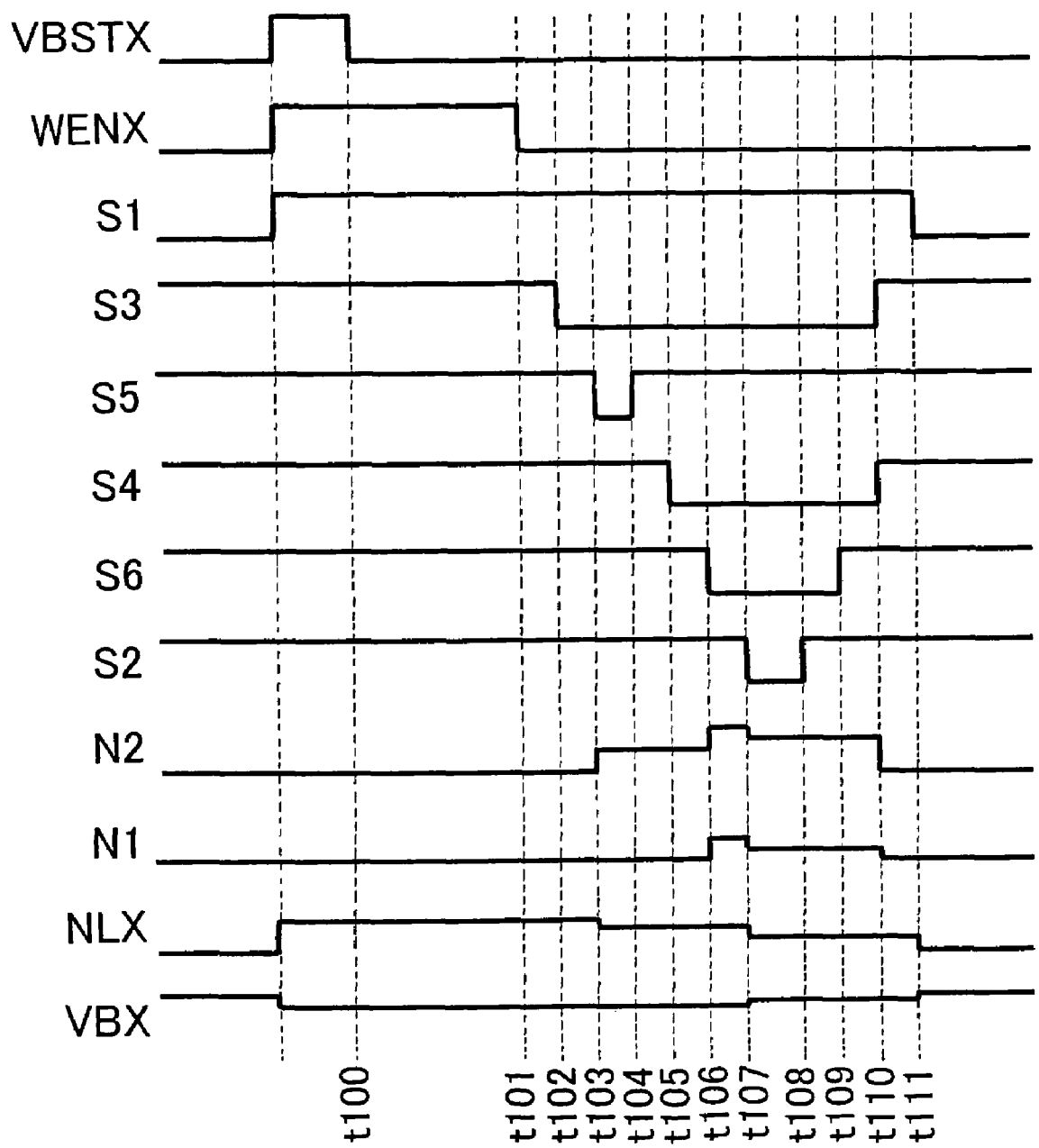
FIG. 14 is a timing chart showing operation of the semiconductor memory device conducted at the time of writing according to the fourth embodiment of the present invention.

Referring to FIG. 14, current supply from the boost capacitance is finished at time t100. Unlike the first embodiment, however, the boost capacitance is not charged in a moment. Unlike the first embodiment, the signal S1 is separated from the signal VBSTX. If the node (VBX) in the boost circuit is charged, a current flows from the power supply Vdd and consequently power supply noise is caused. The power supply noise lowers the precision of the constant current in the X side write constant current source circuit using the same power supply Vdd. In this embodiment, the boost capacitance is not charged during the operation of the constant current source circuit, and consequently this disadvantage is not caused.

When the constant current source circuit stops at time t101, the node NLX retains the potential (charge) without being reset. Then, the signal S3 becomes "low" at time t102, and the node N1 gets into the floating state. At time t103, the node NLX and the node N1 are electrically connected to each other by the signal S5, and charge is transferred from the node NLX to N1. After N1 gets into the floating state again at time t104, the node N2 is brought into the floating state at time t105. At time t106, the node N2 and the node NLX are electrically connected to each other. Since the node N1 is floating at this time, the potential at the node N1 rises by substantially the potential at the node NLX due to coupling of the capacitance element CRX. At time t107, the signal S2 is activated and charge is transferred from the node N1 to the node NLX. At this time, the potential at the node NLX falls due to coupling through the capacitance element CRX. Substantially, therefore, charge at the node NLX is transferred to the node VBX in the boost circuit. During the time between t108 and t110, respective signals are reset. Finally, the node VBX is charged up to the potential at the power supply Vdd at time t111. As compared with the first embodiment, power required for charging is low.

Fifth Embodiment

A semiconductor memory device according to a fifth embodiment of the present invention will now be described.

Figure 15:
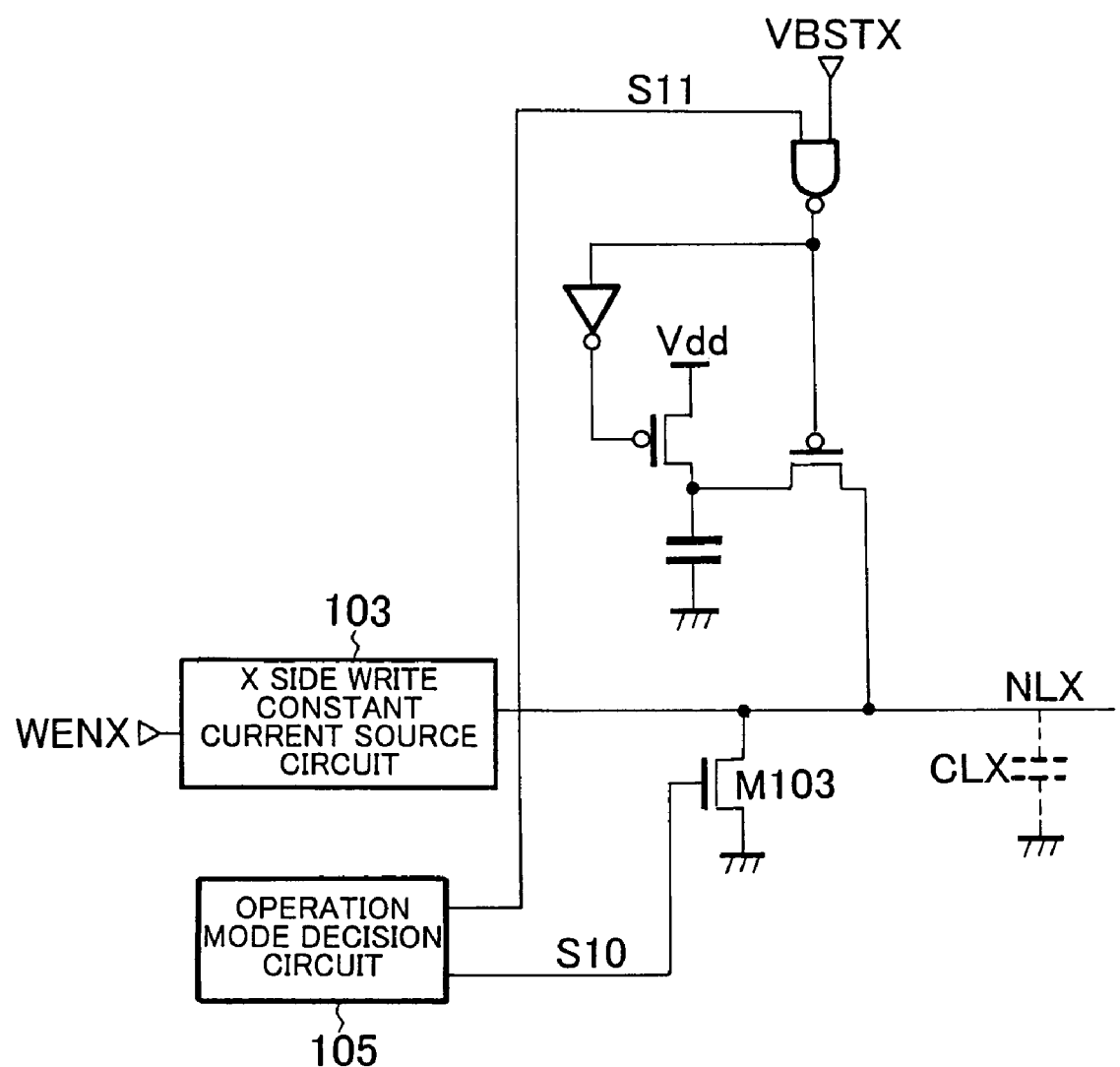
FIG. 15 is a block diagram showing a configuration of a semiconductor memory device according to a fifth embodiment of the present invention.
Figure 17A:
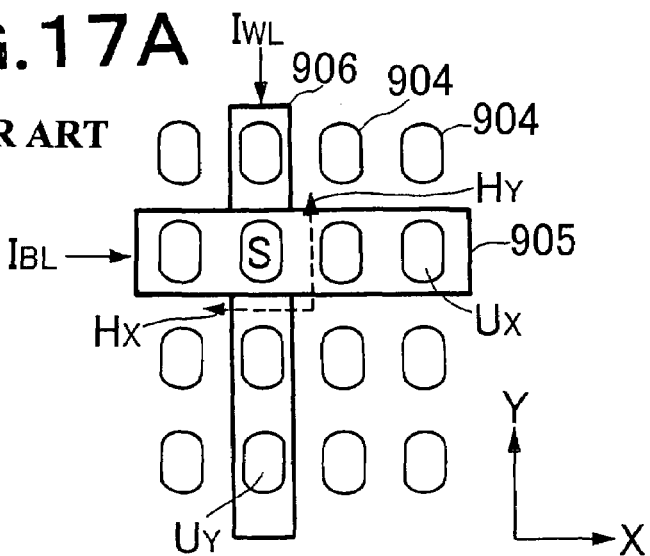
FIG. 17A is a top view showing a memory cell array.
Figure 17B:
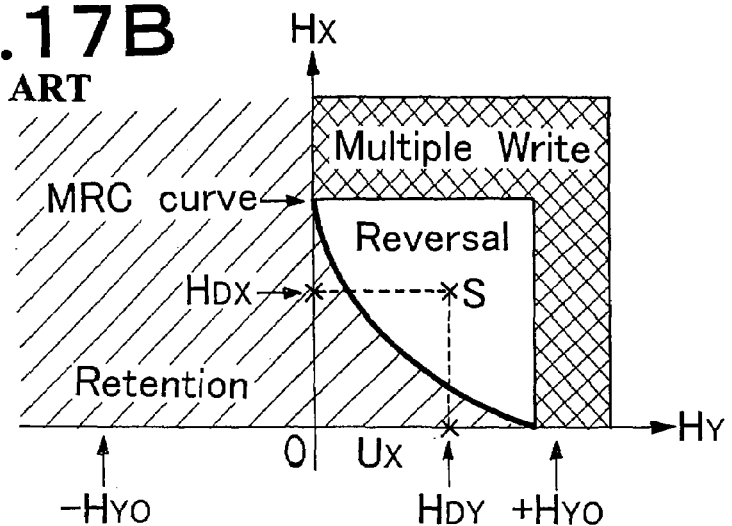
FIG. 17B is a graph showing an asteroid curve represented by using magnetic fields.
Figure 17C:
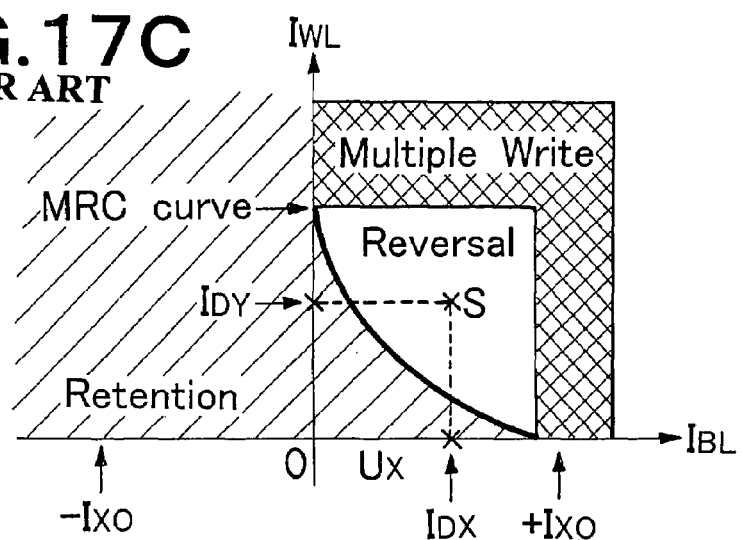
FIG. 17C is a graph showing an asteroid curve represented by using currents.
Figure 18:
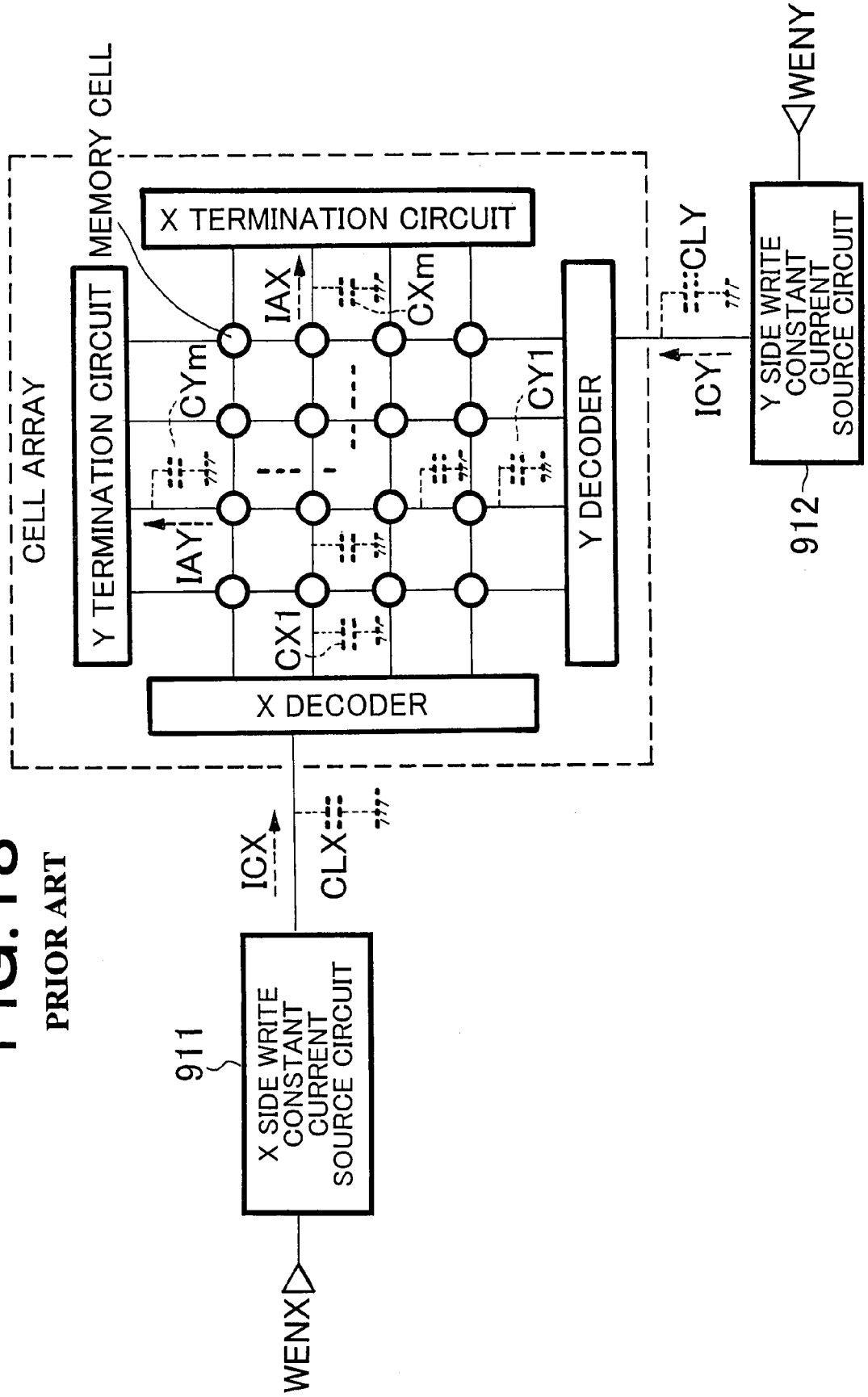
FIG. 18 is a block diagram showing a configuration of a conventional semiconductor memory device.
Figure 19:
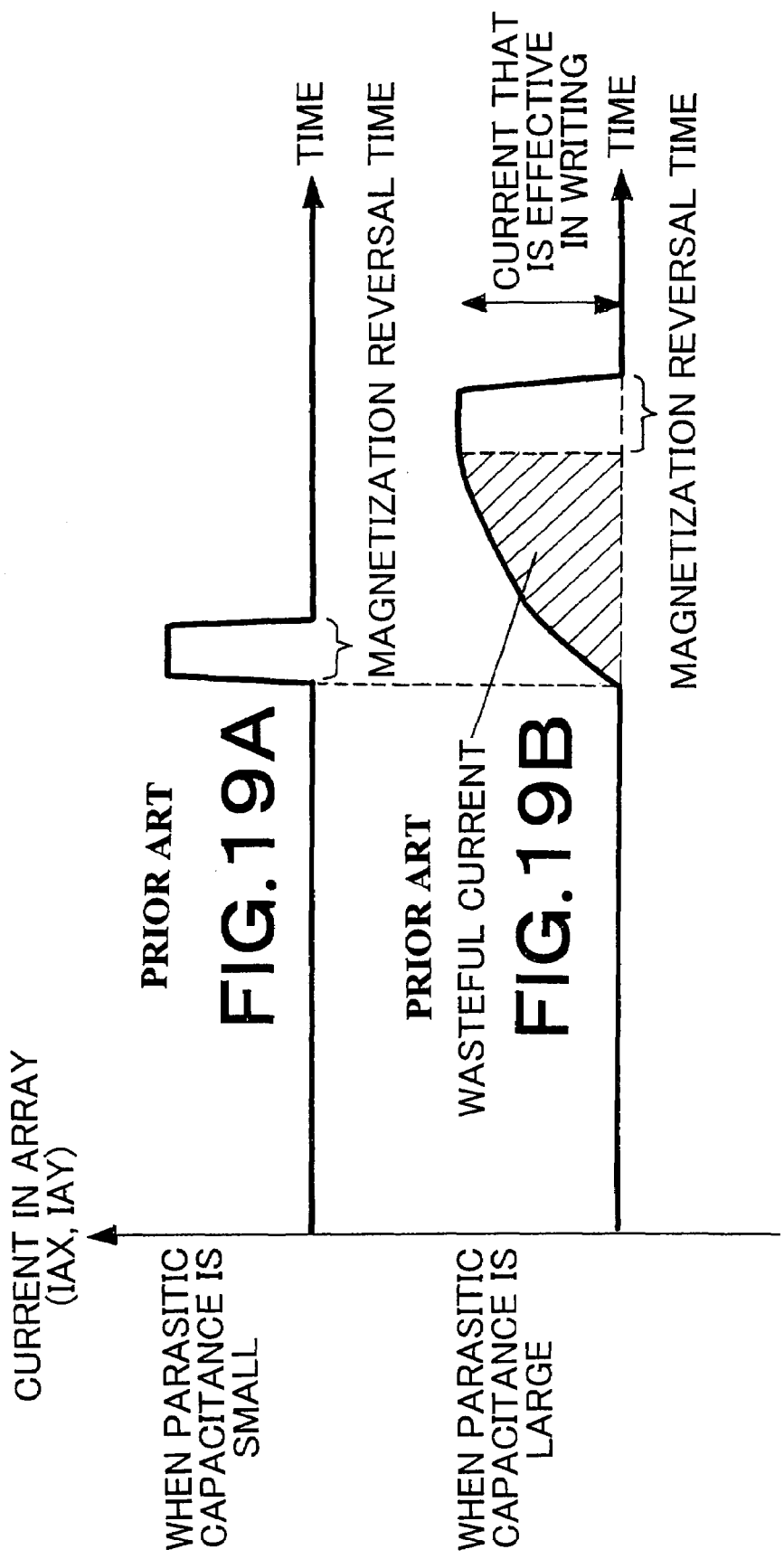
FIGS. 19A and 19B are graphs showing write current waveforms in the conventional semiconductor memory device.

A circuit diagram according to the fifth embodiment of the present invention is shown in FIG. 15. In the present embodiment, a signal S10 is not activated even when the write mode is finished. Therefore, the node NLX is not reset, and the potential at the node NLX does not become the ground potential. Although a reset transistor M103 is omitted in diagrams showing the first to fourth embodiments, it is evident from the operation waveforms that a circuit having such a function is present. Unless reset, charge is retained on the parasitic capacitance of NLX. If a write mode continues after another write mode, an operation mode decision circuit 105 detects continuous writing, turns a continuity detection signal S11 "low," and does not activate the boost capacitance. This is because NLX is already charged and it is not necessary to charge NLX. In this case, power for charging the boost capacitance is saved. If the operation mode decision circuit 105 judges the read mode, the signal S10 is activated and the node NLX is reset.

INDUSTRIAL APPLICABILITY

The present invention can be applied to a semiconductor memory device in which information is written into a storage element by flowing current. In particular, the present invention can be applied to a semiconductor memory device in which information is written into a tunnel magnetoresistance element by a magnetic field generated by flowing current.

The invention claimed is:

1. A semiconductor memory device comprising:
a storage element for storing information;
a constant current source for writing information into the storage element by flowing current; and
a boost circuit for charging parasitic capacitors by a time when an amount of a current flowed by said constant current source reaches an amount of a current required to write information into the storage element, at a predetermined position related to the storage element.

2. The semiconductor memory device according to claim 1, wherein
the storage element is a tunnel magnetoresistance element, and
the predetermined position is a position, a current at which generates a magnetic field applied to the tunnel magnetoresistance element.

3. The semiconductor memory device according to claim 1, wherein
said boost circuit comprises a condenser for storing charge to charge the parasitic capacitors.

4. The semiconductor memory device according to claim 3, further comprising a circuit for setting a voltage between both electrodes of the condenser to a voltage greater than a power supply voltage.

5. The semiconductor memory device according to claim 3, wherein
the condenser is increased to a plurality of condensers, and
said boost circuit comprises switching means for selecting one or more condensers to be used for charging, according to an amount of charge required to charge the parasitic capacitors.

6. The semiconductor memory device according to claim 5, wherein the switching means switch a combination of condensers to be used for charging, according to an amount of charge required to charge the parasitic capacitors.

7. The semiconductor memory device according to claim 5, wherein capacitances of at least a part of the condensers are mutually related by a geometric progression.

8. The semiconductor memory device according to claim 5, wherein capacitances of at least a part of the condensers are determined according to capacitances of the parasitic capacitors depending upon an amount of a current required to write information into the storage element.

9. The semiconductor memory device according to claim 5, wherein capacitances of at least a part of the condensers are determined according to capacitances of the parasitic capacitors depending upon a position of the storage element.

10. The semiconductor memory device according to claim 5, wherein capacitances of at least a part of the condensers are determined according to capacitances of the parasitic capacitors depending upon a process condition.

11. The semiconductor memory device according to claim 3, comprising returning means for returning at least a part of charge on parasitic capacitors which are present on a current path of a current for writing information into the storage element, to a node where charge of said boost circuit is stored.

12. The semiconductor memory device according to claim 3, wherein a time when storing charge in said boost circuit is set at a time after completion of an operation period of said constant current source.

13. The semiconductor memory device according to claim 1, comprising charge retention means for retaining a part of charge on parasitic capacitors which are present on a current path of a current for writing information into the storage element, in dependence on history of an operation mode, so as to suppress discharge of said boost circuit.

* * * * *